(12) United States Patent
Kato

(10) Patent No.: US 12,412,735 B2
(45) Date of Patent: Sep. 9, 2025

(54) PLASMA PROCESSING APPARATUS

(71) Applicant: Tokyo Electron Limited, Tokyo (JP)

(72) Inventor: Shusei Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 453 days.

(21) Appl. No.: 18/085,583

(22) Filed: Dec. 21, 2022

(65) Prior Publication Data

US 2023/0207282 A1   Jun. 29, 2023

(30) Foreign Application Priority Data

Dec. 28, 2021 (JP) .................. 2021-215091
Oct. 11, 2022 (JP) .................. 2022-163154

(51) Int. Cl.
   *H01J 37/32* (2006.01)
(52) U.S. Cl.
   CPC ... *H01J 37/32642* (2013.01); *H01J 2237/024* (2013.01); *H01J 2237/334* (2013.01)
(58) Field of Classification Search
   CPC ........... H01J 37/32642; H01J 2237/024; H01J 2237/334; H01J 2237/332–3348
   USPC ...................................................... 156/345.3
   See application file for complete search history.

(56) References Cited

U.S. PATENT DOCUMENTS

| | | | |
|---|---|---|---|
| 2017/0213758 A1* | 7/2017 | Rice | H01J 37/32082 |
| 2018/0135172 A1* | 5/2018 | Nogami | C23C 16/4586 |
| 2019/0363003 A1* | 11/2019 | Sarode Vishwanath | H01L 21/68735 |
| 2020/0219753 A1* | 7/2020 | Uchida | H01L 21/6831 |
| 2020/0395195 A1* | 12/2020 | Sanchez | H01L 21/67069 |

FOREIGN PATENT DOCUMENTS

JP   2021-141313 A   9/2021

* cited by examiner

*Primary Examiner* — Charlee J. C. Bennett
(74) *Attorney, Agent, or Firm* — XSENSUS LLP

(57) ABSTRACT

There is a plasma processing apparatus, comprising: a plasma processing chamber; a substrate support having a ring supporting surface; an insulating ring disposed on the ring supporting surface, the insulating ring having at least three through holes, each of the through holes having upper and lower hole portions, the lower hole portion having a flaring shape; a conductive ring supported by the insulating ring, the conductive ring having at least three grooves on a lower surface, the grooves corresponding to the through holes; at least three lift pins disposed below the ring supporting surface, the lift pins corresponding to the grooves, each of the lift pins having upper and lower supporting portions, the upper supporting portion being configured to support the conductive ring, the lower supporting portion configured to support the insulating ring; and at least one actuator configured to vertically move the pins.

19 Claims, 23 Drawing Sheets

PLASMA PROCESSING APPARATUS

CROSS-REFERENCE TO RELATED APPLICATIONS

This application claims priority to Japanese Patent Application No. 2021-215091 filed on Dec. 28, 2021 and Japanese Patent Application No. 2022-163154 filed on Oct. 11, 2022, the entire contents of which are incorporated herein by reference.

TECHNICAL FIELD

The present disclosure relates to a plasma processing apparatus.

BACKGROUND

Japanese Laid-open Patent Publication No. 2021-141313 discloses a substrate support having an annular member mounting surface on which an annular member is mounted, and three or more lifters which are configured to protrude from the annular member mounting surface. According to the description in the Japanese Laid-open Patent Publication, a concave portion formed by a concave surface which is concave upward is provided at a location on a bottom of the annular member corresponding to each lifter, and when viewed from a plane, the concave portion is larger than a transfer precision of the annular member upward of the annular member mounting surface, and is formed to be larger than an upper end portion of the lifter. Further, the upper end portion of the lifter is formed in a hemispherical shape, and the concave surface has a smaller curvature than the concave surface forming the hemispherical shape of the upper end portion of the lifter.

SUMMARY

The technique of the present disclosure provides a plasma processing apparatus that can properly position a ring assembly to a substrate support.

In accordance with an aspect of the present disclosure, there is a plasma processing apparatus, comprising: a plasma processing chamber; a substrate support disposed in the plasma processing chamber, the substrate support having a substrate supporting surface and a ring supporting surface; an insulating ring disposed on the ring supporting surface, the insulating ring having at least three through holes, each of the at least three through holes having an upper hole portion and a lower hole portion, the upper hole portion having a first width in a radial direction of the insulating ring and a second width in a circumferential direction of the insulating ring, the second width being smaller than the first width, the lower hole portion having a flaring shape spreading downward when viewed from a side; a conductive ring supported by the insulating ring, the conductive ring having at least three grooves on a lower surface, the at least three grooves corresponding to the at least three through holes, respectively, each of the at least three grooves having a third width in a radial direction of the conductive ring and a fourth width in a circumferential direction of the conductive ring, the fourth width being smaller than the third width; at least three lift pins disposed below the ring supporting surface, the at least three lift pins corresponding to the at least three grooves, respectively, each of the at least three lift pins having an upper supporting portion and a lower supporting portion, the upper supporting portion being configured to support the conductive ring from downward by contacting a bottom of the groove of the conductive ring through the through hole of the insulating ring, the lower supporting portion configured to support the insulating ring from downward by contacting an inclined surface of the insulating ring, the inclined surface defining the lower hole portion; and at least one actuator configured to vertically move the at least three lift pins.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
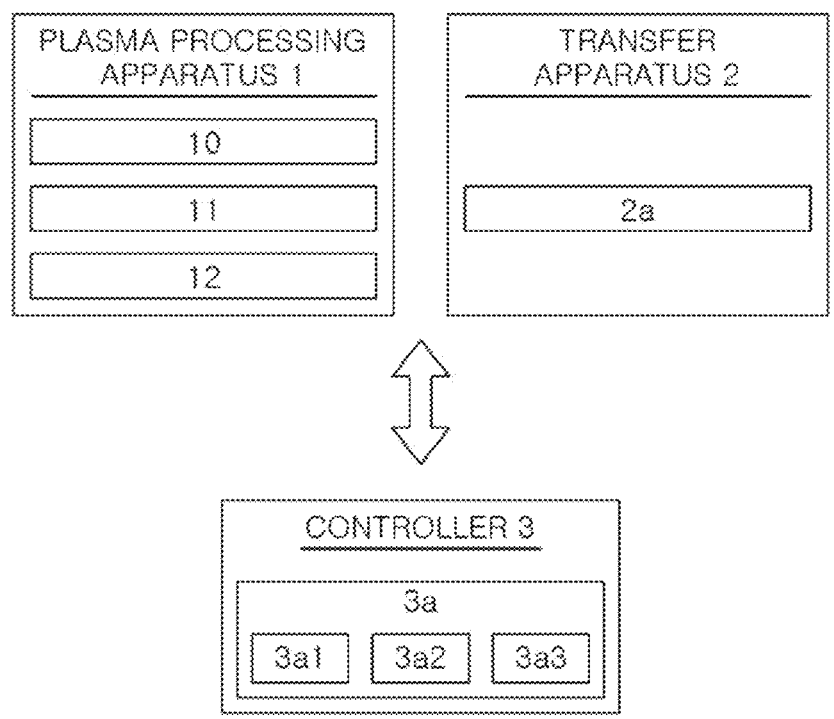
FIG. 1 is an explanatory diagram illustrating an outline of a configuration of a plasma processing system.

In a manufacturing process of semiconductor devices, plasma processing such as etching or the like is performed on a semiconductor substrate (hereinafter, simply referred to as "substrate") using plasma. The plasma processing is performed in a state in which a substrate is mounted on a substrate support placed in a processing container configured to be decompressed.

In addition, the substrate support includes a plurality of annular members placed to surround around the substrate on the substrate support in order to obtain an excellent and uniform processing result at a center and a periphery of the substrate at the time of the plasma processing. The plurality of annular members includes an edge ring placed adjacent to the substrate on the substrate support or a cover ring placed to cover an outer surface of the edge ring. Since the annular members are consumed by being exposed to plasma, the annular members need to be regularly replaced. The replacement of the annular member is executed, for example, by using a lifter which is lifted while supporting the annular member and a transfer mechanism transferring the annular member.

Here, when replacing the annular members using the lifter or transfer mechanism, the annular members may not be appropriately placed at desired positions on the substrate support due to transfer precision by the transfer mechanism, etc., for example. In addition, in recently implementing a transfer function of the annular member, enhancement of installation precision of the annular member on the substrate support is further require than the transfer precision by the transfer mechanism.

In the plasma processing apparatus disclosed in the Japanese Laid-open Patent Publication, a groove is formed on a bottom of an edge ring, the groove being larger than the transfer precision by the transfer mechanism, and a through hole is formed in the cover ring, the through hole being larger than the transfer precision by the transfer mechanism, thereby enhancing positioning precision of the annular member.

However, when the replacement of the annular member is executed by using the plasma processing apparatus described in the Japanese Laid-open Patent Publication, for example, there is a risk that the positioning precision of the annular member will deteriorate or damage the lifter or the annular member when a relative dislocation occurs between positions of the lifter and the groove (through hole) due to a mechanical difference (e.g., processing tolerance) or thermal expansion of the annular member.

The technique according to the present disclosure is derived by considering the circumstances, and provides a plasma processing apparatus that can properly position a ring assembly to the substrate support. Hereinafter, a configuration of a plasma processing system including a substrate processing apparatus according to the exemplary embodiment will be described with reference to the drawings. Further, in the present specification and drawings, the same reference numerals are given to elements having substantially the same functional configuration, so a redundant description will be omitted.

<Plasma Processing System>

In an exemplary embodiment, a plasma processing system includes a plasma processing apparatus 1, a transfer apparatus 2, and a controller 3, as illustrated in FIG. 1. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. Further, the plasma processing chamber 10 includes at least one gas inlet for supplying at least one processing gas to the plasma processing space and at least one gas outlet for exhausting gases from the plasma processing space. The gas inlet is connected to a gas supply 20 to be described below and the gas outlet is connected to an exhaust system 40 to be described below. The substrate support 11 is disposed in the plasma processing space, and has a substrate supporting surface for supporting a substrate.

The plasma generator 12 is configured to generate a plasma from at least one processing gas supplied in the plasma processing space. The plasma formed in the plasma processing space may be a capacitively coupled plasma (CCP), an inductively coupled plasma (ICP), an electron-cyclotron-resonance plasma (ECR plasma), a helicon wave plasma (HWP), or a surface plasma (SWP). Further, various types of plasma generator may be used, which include an alternating current (AC) plasma generator and a direct current (DC) plasma generator. In an exemplary embodiment, an AC signal (AC power) used in the AC plasma generator has a frequency in a range of 100 kHz to 10 GHz. Therefore, the AC signal includes a radio frequency (RF) signal and a microwave signal. In an exemplary embodiment, the RF signal has a frequency in a range of 100 kHz to 150 MHz.

The transfer apparatus 2 includes a transfer arm 2a that holds and transfers a substrate W and a ring assembly 120 to be described below. A wafer is an example of the substrate W. The transfer apparatus 2 is configured to transfer the substrate W and the ring assembly 120 between the outside of the plasma processing apparatus 1 and the substrate support 11 placed inside the plasma processing apparatus 1.

The controller 3 processes a computer executable command which allows the plasma processing apparatus 1 and the transfer apparatus 2 to execute various processes described in the present disclosure. The controller 3 may be configured to control each element of the plasma processing apparatus 1 and the transfer apparatus so as to execute various processes described herein. In an exemplary embodiment, a part or the entirety of the controller 3 may be included in the plasma processing apparatus 1. The controller 3 may include a processor $3a1$, a storage $3a2$, and a communication interface $3a3$. The controller 3 may be implemented by a computer $3a$, for example. The processor $3a1$ may be configured to perform various control operations by reading a program from the storage $3a2$ and executing the read program. The program may be stored in the storage $3a2$ in advance or obtained through a medium as necessary. The obtained program is stored in the storage $3a2$, and read and executed from the storage $3a2$ by the processor $3a1$. The medium may be various storage media readable by the computer $3a$ or a communication line connected to the communication interface $3a3$. The processor $3a1$ may be a central processing unit (CPU). The storage $3a2$ may include a random access memory (RAM), a read only memory (ROM), a hard disk drive (HDD), a solid state drive (SSD), or a combination thereof. The communication interface $3a3$ may communicate with the plasma processing apparatus 1 through a communication line such as local area network (LAN), etc. Further, the storage media may be transitory or non-transitory.

<Plasma Processing Apparatus>

Figure 2:
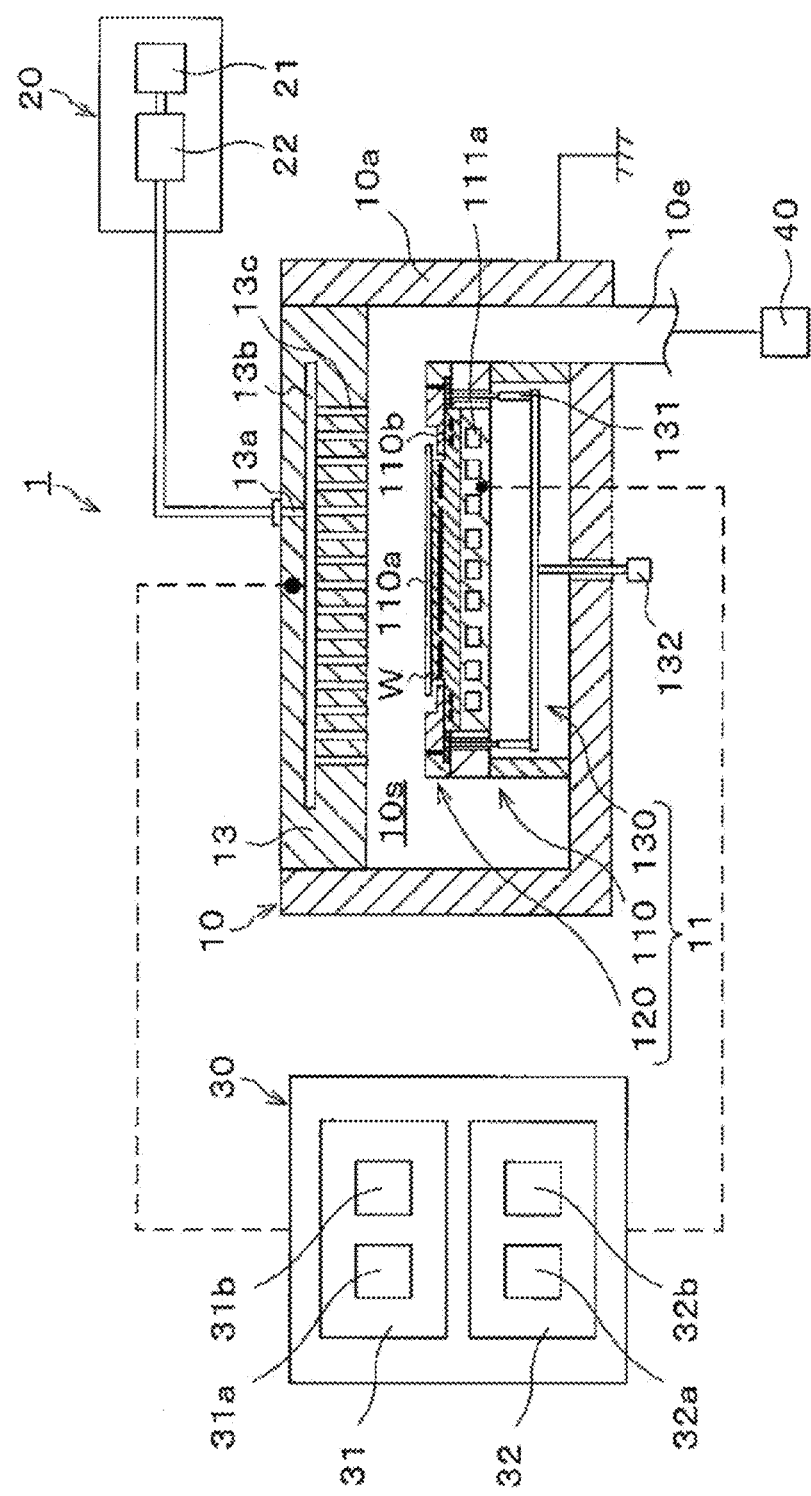
FIG. 2 is a longitudinal cross-sectional view illustrating an outline of a configuration of a plasma processing apparatus according to an exemplary embodiment.
Figure 3:
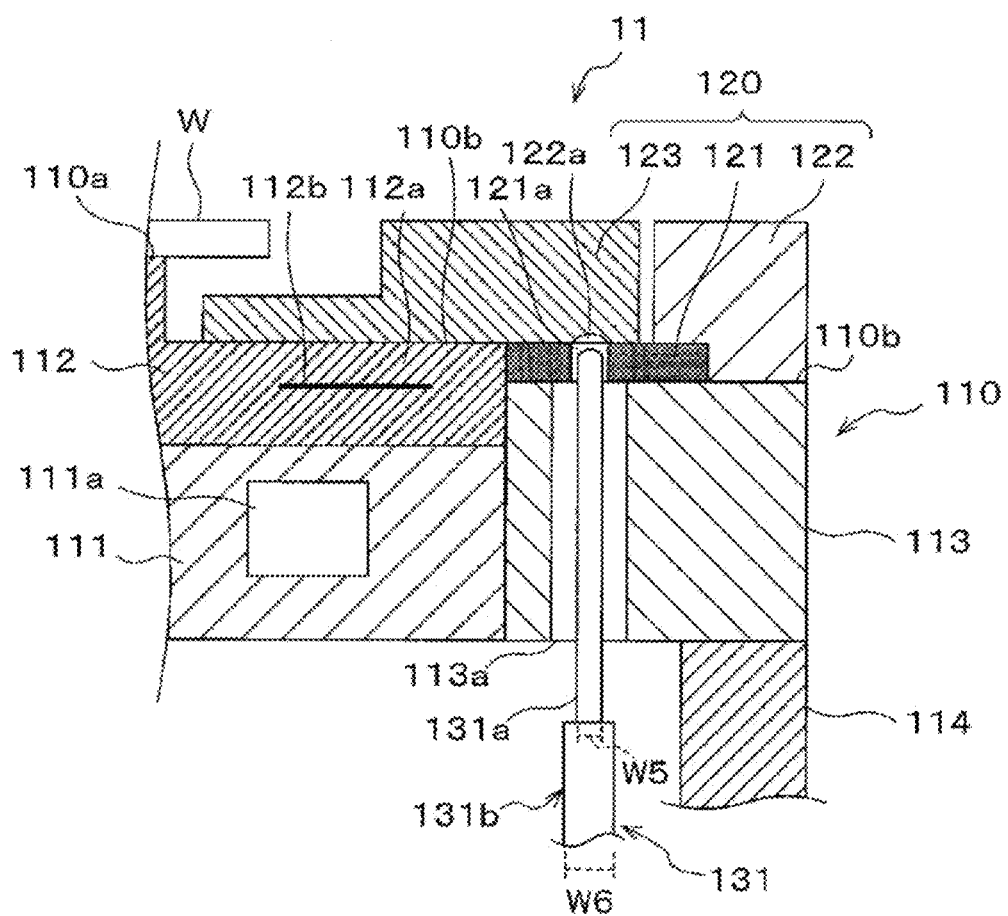
FIG. 3 is a partial enlarged view of FIG. 2.

Next, as an example of the plasma processing apparatus 1, an example of a configuration of a capacitively coupled plasma processing apparatus 1 will be described. FIG. 2 is a longitudinal cross-sectional view illustrating an outline of a configuration of a plasma processing apparatus 1 according to an exemplary embodiment. FIG. 3 is a partial enlarged view enlarging and illustrating a part of a configuration of a substrate support 11 illustrated in FIG. 2.

The capacitively coupled plasma processing apparatus 1 includes a plasma processing chamber 10, a gas supply 20, a power supply 30, and an exhaust system 40. Further, the plasma processing apparatus 1 includes the substrate support 11 and a gas introduction unit. The gas introduction unit is configured to introduce at least one processing gas into the plasma processing chamber 10. The gas introduction unit includes a showerhead 13. The substrate support 11 is placed in the plasma processing chamber 10. The showerhead 13 is placed above the substrate support 11. In an exemplary embodiment, the showerhead 13 constitutes at least a part of a ceiling of the plasma processing chamber 10. The plasma processing chamber 10 has a plasma processing space 10s defined by the showerhead 13, a side wall 10a of the plasma processing chamber 10, and the substrate support 11. The plasma processing chamber 10 is grounded. The showerhead 13 and the substrate support 11 are electrically insulated from a housing of the plasma processing chamber 10.

The substrate support 11 includes a body 110, a ring assembly 120, and a lifter 130. The body 110 has a central region 110a for supporting the substrate W and an annular region 110b for supporting the ring assembly 120. The annular region 110b of the body 110 surrounds the central region 110a of the body 110 in a plan view. The substrate W is disposed on the central region 110a of the body 110, and the ring assembly 120 is placed on the annular region 110b of the body 110 to surround the substrate W on the central region 110a of the body 110. Therefore, the central region 110a is also called a substrate supporting surface for supporting the substrate W, and the annular region 110b is also called a ring supporting surface for supporting the ring assembly 110.

As illustrated in FIG. 3, in an exemplary embodiment, the body 110 includes a base 111, an electrostatic chuck 112, a support 113, and an insulator 114.

The base 111 includes a conductive member. The conductive member of the base 111 may serve as a lower electrode. The electrostatic chuck 112 is placed on the base 111. The electrostatic chuck 112 includes a ceramic member 112a and an electrostatic electrode 112b placed in the ceramic member 112a. The ceramic member 112a has the central region 110a. In an exemplary embodiment, the ceramic member 112a and the support 113 have the annular region 110b. Further, another member surrounding the electrostatic chuck 112 may have the annular region 110b such as an annular electrostatic chuck instead of an annular insulating member such as the support 113. The ring assembly 120 may be placed on the annular electrostatic chuck or the annular insulating member or placed on both the electrostatic chuck 112 and the annular insulating member. Alternatively, the constitution of the annular electrostatic chuck or the annular insulating member is omitted, and the ring assembly 120 may be placed only on the electrostatic chuck 112.

Further, at least one RF/DC electrode coupled to a radio frequency (RF) power supply 31 and/or direct current (DC) power supply 32 to be described below may be placed in the ceramic member 112a. In this case, at least one RF/DC electrode serves as the lower electrode. When a bias RF signal and/or DC signal to be described below is supplied to at least one RF/DC electrode, the RF/DC electrode is also called a bias electrode. Further, the conductive member of the base 111 and at least one RF/DC electrode may serve as a plurality of lower electrodes. Further, the electrostatic electrode 112b may serve as the lower electrode. Therefore, the substrate support 111 includes at least one lower electrode.

The support 113 is a member formed in a ring shape when viewed on the plan view by using an insulating material such as quartz, etc., for example and supports the base 111 and the electrostatic chuck 112. In an exemplary embodiment, the ring assembly 120 is mounted on the support 113 as described above. Further, a plurality of, in the exemplary embodiment, three through holes 113a penetrating in a thickness direction are formed in the support 113. A lift pin 131 to be described below of the lifter 130 is inserted into the through hole 113a as illustrated in FIG. 3.

The insulator 114 is a cylindrical member made of ceramic, etc., and supports the support 113. The insulator 114 is formed to have an outer diameter equal to an outer diameter of the support 113, for example, and supports a periphery of the support 113.

The ring assembly 120 as the annular member includes a plurality of annular members. As illustrated as an example in FIG. 3, the ring assembly 120 includes an insulating ring 121, an outer edge ring 122, and an inner edge ring 123, as the plurality of annular members. The outer edge ring 122 and the inner edge ring 123 are made of silicon, silicon carbide, or quartz, as an example. The insulating ring 121 is supported on the support 113 constituting the annular region 110b (ring supporting surface). The inner edge ring 123 is supported on the electrostatic chuck 112 and the insulating ring 121 constituting the annular region 110b (ring supporting surface). That is, the insulating ring 121 and the inner edge ring 123 are supported on the support 113 constituting the annular region 110b (ring supporting surface) in order. Further, the ring assembly 120 is lifted up from the annular region 110b (ring supporting surface) by an operation of the lifter 130, and thus configured to be transferred by the transfer apparatus 2 placed outside the plasma processing apparatus 1.

Further, the inner edge ring 123 may constitute a "conductive ring" according to the technique of the present disclosure. Further, the outer edge ring 122 may constitute an "additional conductive ring" according to the technique of the present disclosure. In other words, the ring assembly 120 as the annular member includes an insulating ring 121, an additional conductive ring 122, and a conductive ring 123 as a plurality of annular members.

The outer edge ring 122 is formed large in the thickness direction as compared with the insulating ring 121, and placed to surround the inner edge ring 123 and the insulating ring 121, and placed so that an inner part of the outer edge ring 122 overlaps with an outer part of the insulating ring 121 in a vertical direction. In other words, an upper surface of the insulating ring 121 constitutes a support surface for the outer edge ring 122 and the inner edge ring 123.

Further, the configuration of the ring assembly 120 is not limited to an illustrated example, and for example, the insulating ring 121 and the outer edge ring 122 may be integrally configured. In this case, the insulating ring 121 and the outer edge ring 122 may be configured by the same member, that is, the outer edge ring 122 may serve as a part of the insulating ring and the insulating ring may serve as a part of the additional conductive ring.

Figure 4A:
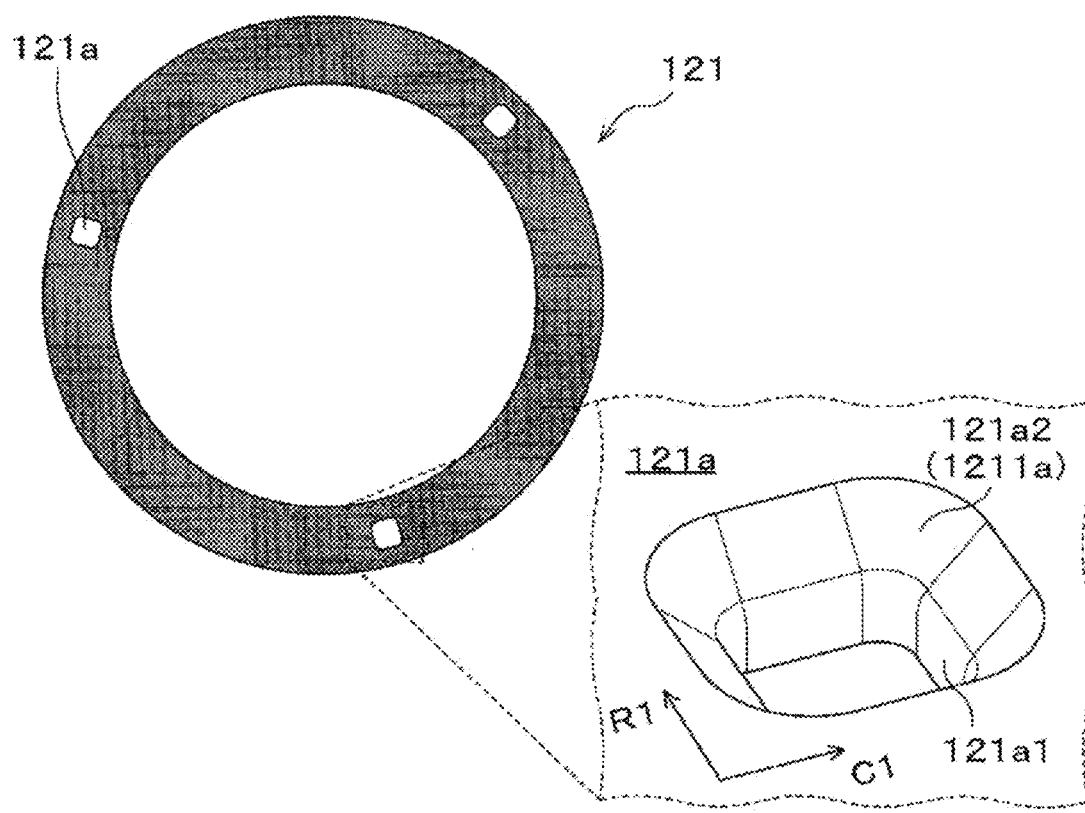
FIG. 4A is an explanatory diagram illustrating an outline of a configuration of an insulating ring.
Figure 4B:
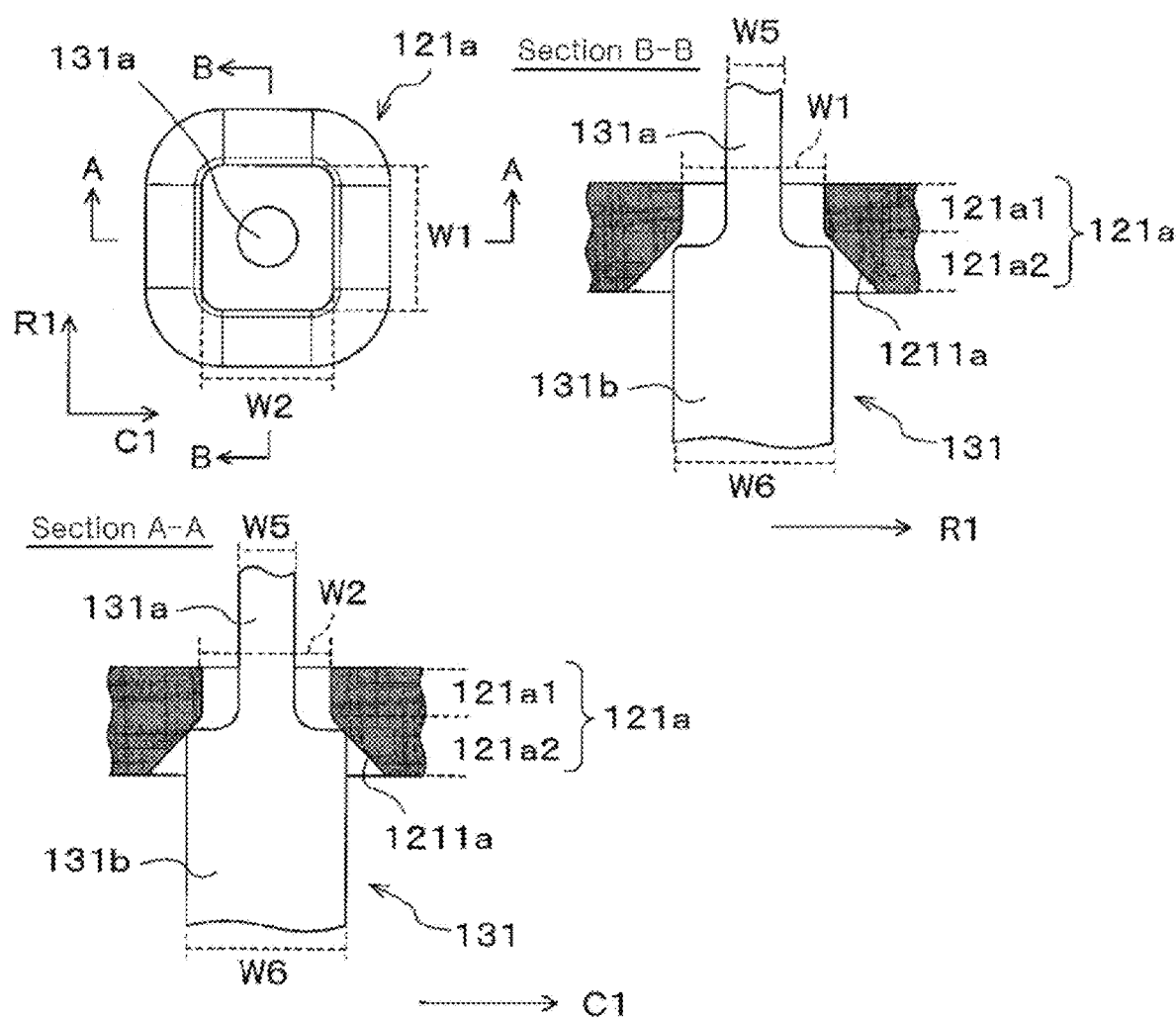
FIG. 4B is an explanatory diagram illustrating the outline of the configuration of the insulating ring.

Further, a plurality of, in the exemplary embodiment, three through holes 121a penetrating in the thickness direction are formed in the insulating ring 121 as illustrated in FIGS. 4A and 4B. The through hole 121 is formed at a position corresponding to the through hole 113a formed in the support 113, and an upper supporting portion 131a of the lift pin 131 to be described below is inserted into the through hole 121a.

Three through hole 121a has an upper hole portion 121a1 and a lower hole portion 121a2. The upper hole portion 121a1 of the through hole 121a has a substantially rectangular shape in which a first width W1 which extends in a radial direction R1 of the insulating ring 121 is formed to be larger than a second width W2 which extends in a circumferential direction C1 of the insulating ring 121 orthogonal to the radial direction R1. The first width W1 is formed to be larger than at least a diameter (a fifth width W5 to be described below) of the upper supporting portion 131a of the lift pin 131 to be described below. The second width W2 is formed to be larger than the diameter (fifth width W5) of the upper supporting portion 131a, and further, formed to be smaller than a diameter (sixth width W6 to be described below) of a lower supporting portion 131b of the lift pin 131 to be described below.

The lower hole portion 121a2 of the insulating ring 121 has a flare shape (inclined surface 1211a) in which the first width W1 and the second width W2 of the upper hole portion 121a1 spread downward (toward a bottom of the insulating ring 121). Preferably, a lower end of the inclined surface 1211a of the lower hole portion 121a2 is formed to be at least larger than the transfer precision of the ring assembly 120 by the transfer apparatus 2.

In the insulating ring 121 according to the exemplary embodiment, therefore, the upper supporting portion 131a of the lift pin 131 is inserted into the upper hole portion 121a1, and the lower supporting portion 131b of the lift pin 131 comes into contact with two points on the inclined surface 1211a of the lower hole portion 121a2 in the circumferential direction C1.

Further, as described above, in the upper hole portion 121a1, the first width W1 which extends in the radial direction R1 is formed to be larger than the second width W2 which extends in the circumferential direction C1, but the sizes of the first width W1 and the second width W2 are preferably set to the same as each other as possible. In other words, the upper hole portion 121a1 preferably has a substantially square shape when viewed in the plan view.

The inner edge ring 123 as the conductive ring may also called a focus ring, and enhances in-plane uniformity of the plasma processing for the substrate W. Further, the outer edge ring 122 as the additional conductive ring substantially expands an area of a conductive part (inner edge ring 123) viewed in the plane on the substrate support 11. The inner edge ring 123 and the outer edge ring 122 may be made of the silicon, the silicon carbide, or the quartz, as an example.

Figure 5A:
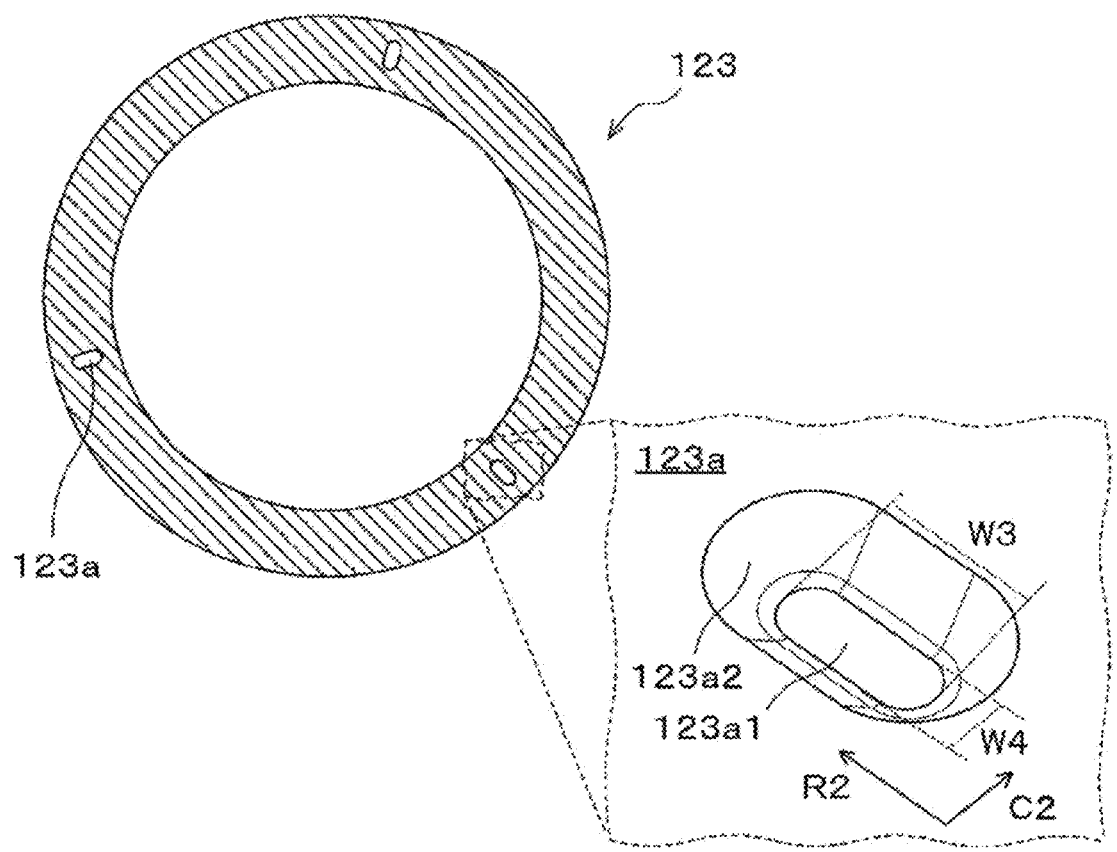
FIG. 5A is an explanatory diagram illustrating the outline of the configuration of an inner edge ring.
Figure 5B:
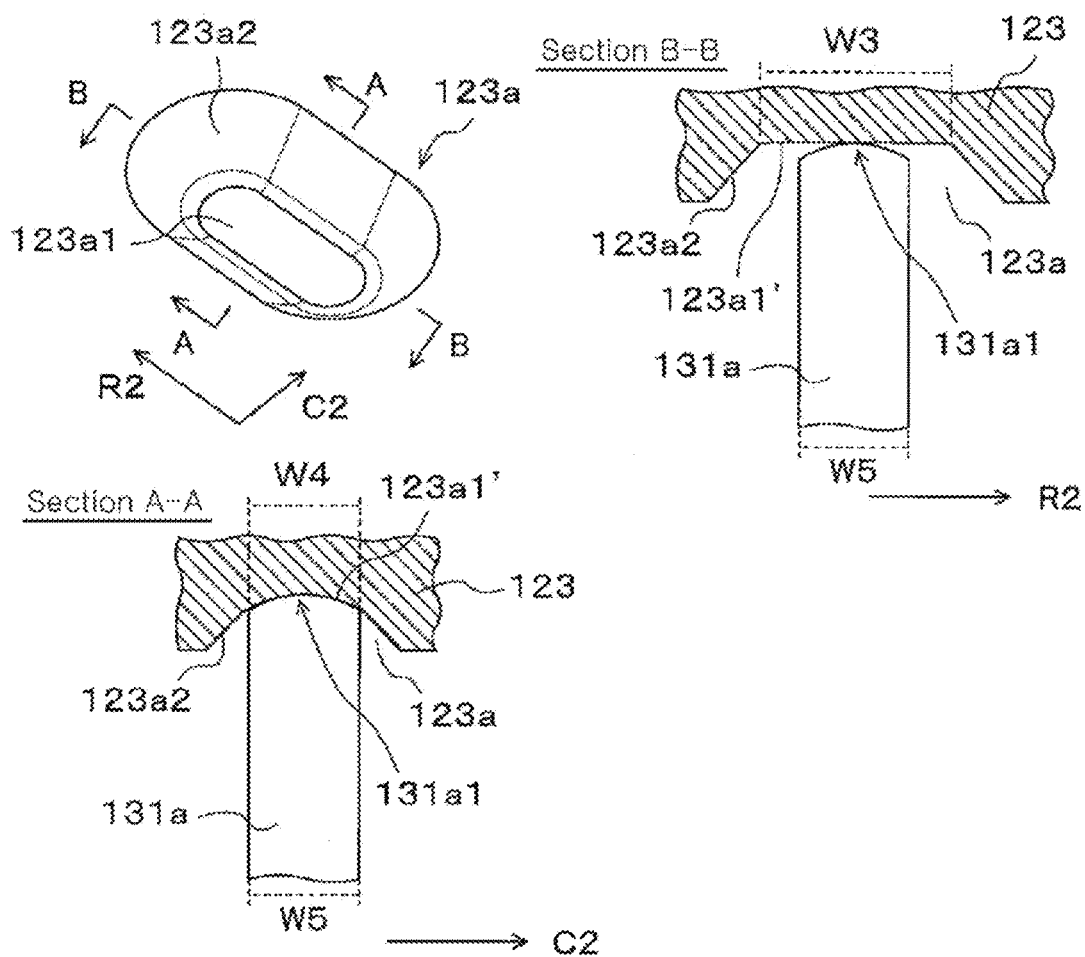
FIG. 5B is an explanatory diagram illustrating the outline of the configuration of the inner edge ring.

A plurality of, in the exemplary embodiment, three grooves 123a are formed on the bottom of the inner edge ring 123 as illustrated in FIGS. 5A and 5B. The groove 123a is formed at a position corresponding to the through hole 121a formed in the insulating ring 121, and a tip of the upper supporting portion 131a of the lift pin 131 inserted into the through hole 121a contacts the bottom 123a1.

Three grooves 123a have a substantially long hole shape in which a third width W3 which extends in a radial direction R2 of the inner edge ring 123 is formed to be larger than a fourth width W4 which extends in a circumferential direction C2 of the inner edge ring 123 orthogonal to the radial direction R2. The third width W3 is formed to be larger than a diameter (a fifth width W5) of the upper supporting portion 131a. The fourth width W4 is formed to have the substantially same size as the diameter (the fifth width W5 to be described below) of the upper supporting portion 131a of the lift pin 131 to be described below.

Further, the bottom 123a1 of three grooves 123a has a shape of being fitted into a tip shape of the upper supporting portion 131a of the lift pin 131, in particular, in an extension direction of the fourth width W4. Specifically, in the exemplary embodiment, as described below, the upper supporting portion 131a has a hemispherical shape 131a1 in which the tip protrudes as described below, but the bottom 123a1 of the groove 123a is formed in a concave shape (hereinafter, the bottom 123a1 having a curve shape may be referred to as a "curved bottom 123a1") having the substantially same curvature as the hemispherical shape 131a1.

An inclined portion is formed on a flare-shaped side surface 123a2 of three grooves 123a so that the third width W3 and the fourth width W4 spread downward (toward the bottom of the inner edge ring 123). A lower end of the inclined surface 1211a of the groove 123a is preferably formed to be at least larger than the transfer precision of the inner edge ring 123 by the transfer apparatus 2.

In the inner edge ring 123 according to the exemplary embodiment, therefore, the upper supporting portion 131a of the lift pin 131 is in line-contact with the bottom 123a1 in a circumferential direction (a fourth width (W4) direction) of the inner edge ring 123.

Further, a depth of the groove 123a is 0.4 mm or more and 1.0 mm or less, as an example.

In an exemplary embodiment, the lifter 130 includes a plurality of, in the exemplary embodiment, three lift pins 131 corresponding to the through holes 121a of the insulating ring 121 and the grooves 123a of the inner edge ring 123, and at least one actuator 132. Further, the lift pin 131 includes a plurality of cylinder supporting portions having different diameters. As illustrated as an example in FIG. 3, the lift pin 131 includes the upper supporting portion 131a and the lower supporting portion 131b. The upper supporting portion 131a and the lower supporting portion 131b may be integrally configured.

The upper supporting portion 131a at least has the fifth width W5 having a diameter smaller than the first width W1 and the second width W2 of the through hole 121a formed in the insulating ring 121. The fifth width W5 has the substantially same size as the fourth width W4 of the groove 123a formed in the inner edge ring 123. The upper supporting portion 131a is concatenated in an axial direction from the upper surface of the lower supporting portion 131b to be described below, and moves in a vertical direction (axial direction) integrally with the lower supporting portion 131b by the operation of the actuator 132. In addition, the upper supporting portion 131a is configured to be projected and depressed from the upper surface of the insulating ring 121 via the through hole 121a, and therefore, supports the bottom of the inner edge ring 123 supported on the upper surface of the insulating ring 121, more specifically, the bottom 123a1 of the groove 123a formed in the inner edge ring 123, and moves (lifts up) the bottom 123a1 in the vertical direction.

Further, the tip of the upper supporting portion 131a is formed in a hemispherical shape 131a1 which gradually becomes thinner upward (see FIG. 5B). The hemispherical shape 131a1 has the substantially same curvature as a concave surface of a curved bottom 123a1' of the groove 123a formed in the inner edge ring 123. Therefore, the tip of the upper supporting portion 131a is configured to be in line-contact with the groove 123a formed in the inner edge ring 123.

The lower supporting portion 131*b* at least has a diameter (the sixth width W6 of FIG. 3) larger than the second width W2 of the through hole 121*a* formed in the insulating ring 121. That is, the lower supporting portion 131*b* has a step which protrudes outward in the radial direction from the outer periphery of the upper supporting portion 131*a*, on the top surface thereof. In addition, the lower supporting portion 131*b* is configured to support the inclined surface 1211*a* formed in the lower hole portion 121*a*2 of the through hole 121*a*, and therefore, supports the bottom of the insulating ring 121 and moves (lifts up) the bottom in the vertical direction. Further, in this case, the outer edge ring 122 held on the insulating ring 121 is also moved (lifted up) in the vertical direction at the same time.

The actuator 132 moves the lift pin 131 in the vertical direction (axial direction) to lift the ring assembly 120 (insulating ring 121, the outer edge ring 122, and the inner edge ring 123) above the annular region 110*b* (ring supporting surface). Therefore, the ring assembly 120 is transferred between the substrate support 11 and the transfer arm 2*a* of the transfer apparatus 2. One example of the actuator includes an electrical actuator or an air cylinder, a motor, etc.

Further, the number of actuators 132 placed in the lifter 130 is not particularly limited. That is, for example, the plurality of lift pins 131 may be integrally moved in the vertical direction by one actuator 132. Further, for example, a plurality of actuators 132 may be placed to correspond to the lift pins 131, respectively, and the respective lift pins 131 may be independently moved in the vertical direction.

Further, the substrate support 11 may include a temperature control module configured to control a temperature of at least one of the electrostatic chuck 112, the ring assembly 120, and the substrate W to a target temperature. The temperature control module may include a heater, a heat transfer medium, a path 111*a*, or a combination thereof. In the flow path 111*a*, a heat transfer fluid such as brine or gas flows. In an exemplary embodiment, the flow path 111*a* is formed in the base 111 and one or more heaters are disposed in the ceramic member 112*a* of the electrostatic chuck 112. Further, the substrate support 11 may include a heat transfer gas supply configured to supply heat transfer gas (backside gas) to a gap between a back surface of the substrate W and the upper surface of the electrostatic chuck 112.

FIG. 2 is described again.

The showerhead 13 is configured to introduce at least one processing gas from the gas supply 20 into the plasma processing space 10*s*. The showerhead 13 includes at least one gas inlet 13*a*, at least one gas diffusion space 13*b*, and a plurality of gas introduction ports 13*c*. The processing gas supplied from the gas supply 20 to the gas inlet 13*a* is introduced into the plasma processing space 10*s* from the plurality of gas introduction ports 13*c* by passing through the gas diffusion space 13*b*. Further, the showerhead 13 includes at least one upper electrode. Further, the gas introduction unit may include one or more side gas injectors (SGI) mounted on one or more openings formed on the side wall 10*a* in addition to the showerhead 13.

The gas supply 20 may include at least one gas source 21 and at least one flow controllers 22. In an exemplary embodiment, the gas supply 20 is configured to supply at least one processing gas to the showerhead 13 from the gas sources 21 corresponding to the one or more processing gas, respectively through the flow controllers 22 corresponding thereto, respectively. Each flow controller 22 may include, for example, a mass flow controller or a pressure control type flow controller. Further, the gas supply 20 may include at least one flow modulation device which modulates or pulses the flow of at least one processing gas.

The power supply 30 includes an RF power supply 31 coupled to the plasma processing chamber 10 through at least one impedance matching circuit. The RF power supply 31 is configured to supply at least one RF signal (RF power) to at least one lower electrode and/or at least one upper electrode. Therefore, plasma is generated from at least one processing gas supplied to the plasma processing space 10*s*. Therefore, the RF power supply 31 may serve as at least a part of the plasma generator 12. Further, by supplying the bias RF signal to at least one lower electrode, a bias potential may be generated on the substrate W and ion components in the formed plasma may be attracted to the substrate W.

In an exemplary embodiment, the RF power supply 31 includes a first RF generator 31*a* and a second RF generator 31*b*. The first RF generator 31*a* is configured to be coupled to at least one lower electrode and/or at least one upper electrode through at least one impedance matching circuit, and to generate a source RF signal (source RF power) for plasma generation. In an exemplary embodiment, the source RF signal has a frequency in a range of 10 MHz to 150 MHz. In an exemplary embodiment, the first RF generator 31*a* may be configured to generate a plurality of RF signals having different frequencies. One or more generated source RF signals are supplied to at least one lower electrode and/or at least one upper electrode.

The second RF generator 31*b* is configured to be coupled to at least one lower electrode through at least one impedance matching circuit, and to generate the bias RF signal (bias RF power). The frequency of the bias RF signal may be the same as or different from the frequency of the source RF signal. In an exemplary embodiment, the bias RF signal has a frequency lower than the source RF signal. In an exemplary embodiment, the source RF signal has a frequency in a range of 100 kHz to 60 MHz. In an exemplary embodiment, the second RF generator 31*b* may be configured to generate a plurality of bias RF signals having different frequencies. One or more generated bias RF signals are supplied to at least one lower electrode. Further, in various exemplary embodiments, at least one of the source RF signal and the bias RF signal may be pulsed.

Further, the power supply 30 may include the DC power supply 32 coupled to the plasma processing chamber 10. The DC power supply 32 includes a first DC generator 32*a* and a second DC generator 32*b*. In an exemplary embodiment, the first DC generator 32*a* is configured to be connected to at least one lower electrode and generate a first DC signal. The generated first DC signal is applied to at least one lower electrode. In an exemplary embodiment, the second DC generator 32*b* is configured to be connected to at least one upper electrode and generate a second DC signal. The generated second DC signal is applied to at least one upper electrode.

In various exemplary embodiments, the first and second DC signals may be pulsed. In this case, a sequence of voltage pulses is applied to at least one lower electrode and/or at least one upper electrode. The voltage pulse may have a pulse waveform of a rectangle, a trapezoid, a triangle, or a combination thereof. In an exemplary embodiment, a waveform generator for generating a sequence of voltage pulses from the DC signal is connected between the first DC generator 32*a* and at least one lower electrode. Therefore, the first DC generator 32*a* and the waveform generator constitute a voltage pulse generator. When the second DC generator 32*b* and the waveform generator constitute the voltage pulse generator, the voltage pulse generator is connected to at least one upper electrode. The voltage pulse may have a positive polarity and have a negative polarity. Further, the sequence of voltage pulses may include one or more positive voltage pulses and one or more negative voltage pulses within one cycle. Further, the first and second DC generators 32a and 32b may be provided in addition to the RF power supply 31, or the first DC generator 32a may be provided instead of the second RF generator 31b.

The exhaust system 40 may be connected to a gas outlet 10e provided on a bottom of the plasma processing chamber 10, for example. The exhaust system 40 may include a pressure adjustment valve and a vacuum pump. By the pressure adjustment valve, a pressure in the plasma processing space 10s is adjusted. The vacuum pump may include a turbo molecule pump, a dry pump, or a combination thereof.

Hereinabove, various exemplary embodiments have been described, but the present disclosure is not limited to the exemplary embodiment, but various additions, omissions, substitutions, and modifications may be made. Further, it is possible to form another exemplary embodiment by combining elements in different exemplary embodiments.

Figure 6A:
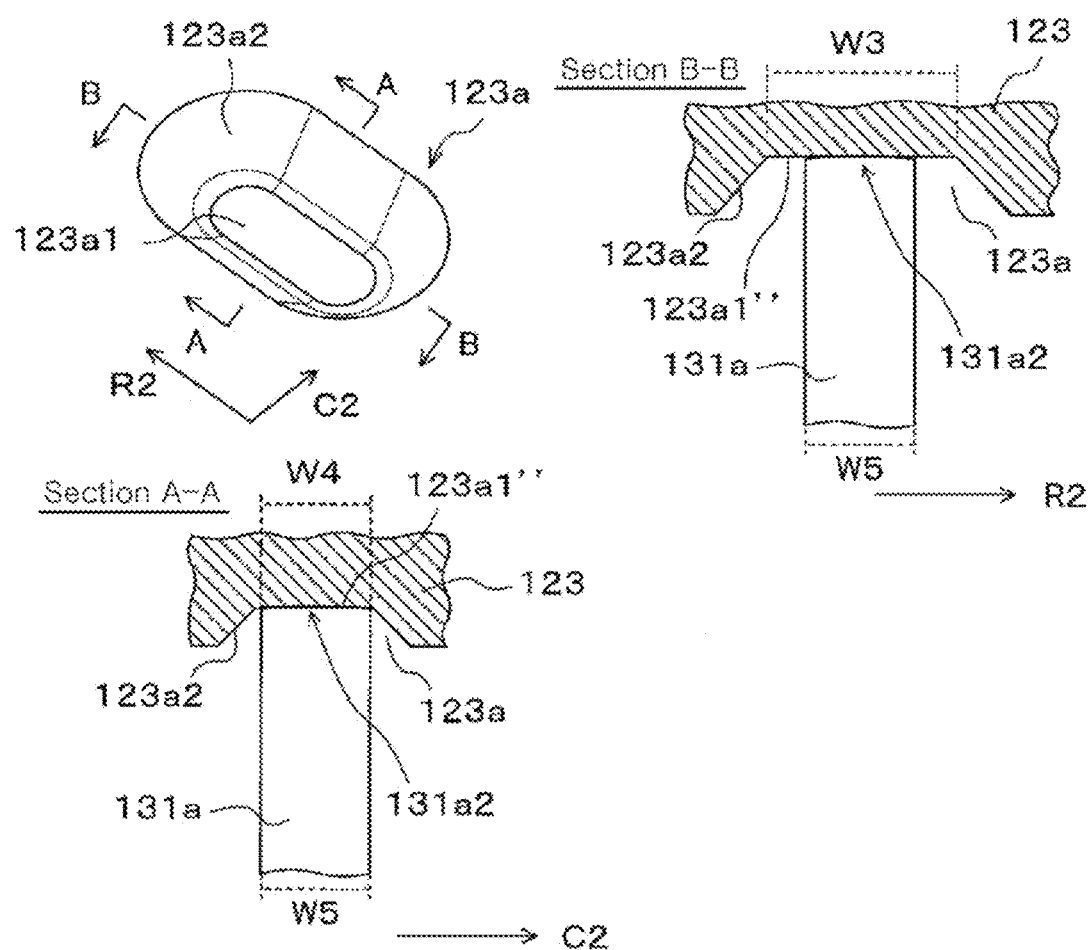
FIG. 6A is an explanatory diagram illustrating another formation example of a groove for the inner edge ring.

For example, in the exemplary embodiment, the tip of the upper supporting portion is formed in the hemispherical shape 131a1 as illustrated in FIG. 3, but the tip of the upper supporting portion 131a may substantially have a flat surface 131a2 as illustrated in FIG. 6A. In this case, in order to contact the tip of the upper supporting portion 131a and the bottom of the groove 123a, the bottom shape of the groove 123a also preferably has a flat bottom 123a1" which engages with the tip of the upper supporting portion 131a instead of the curved bottom 123a1'.

Figure 6B:
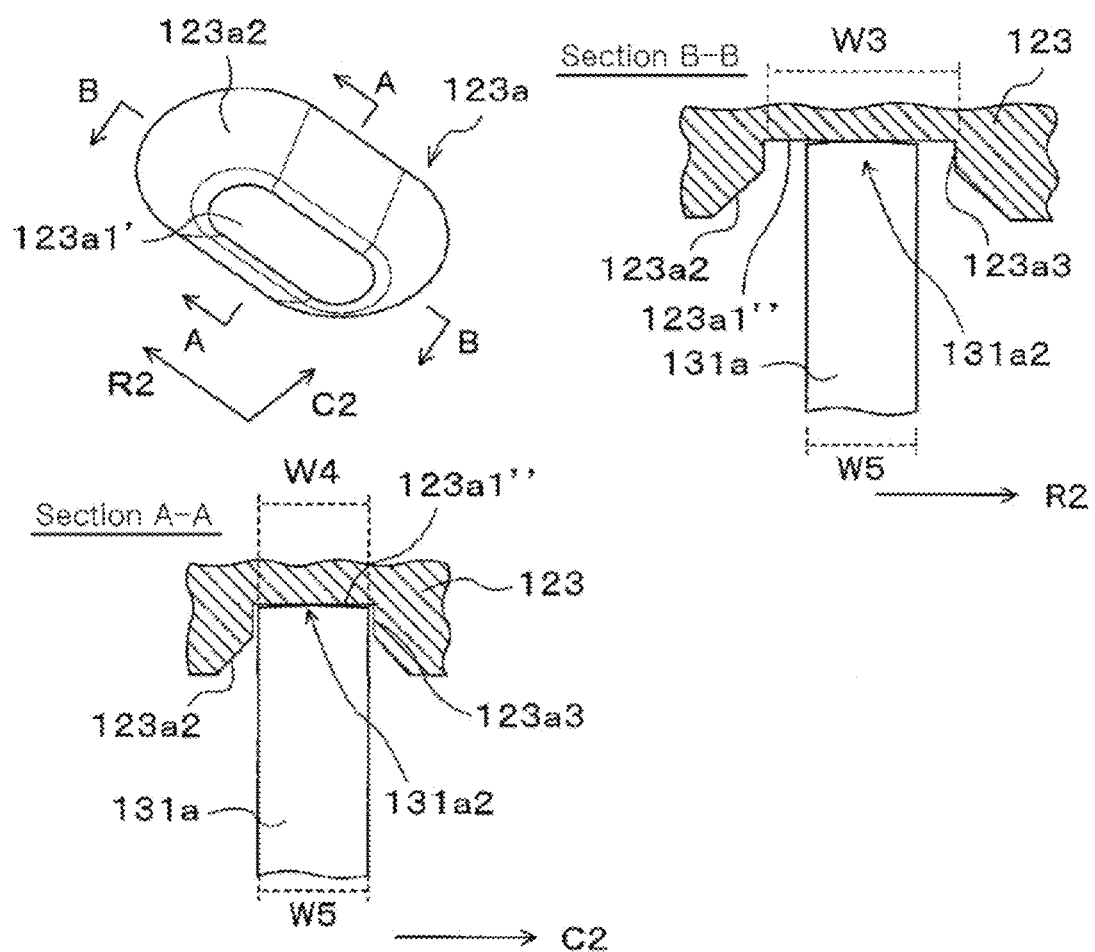
FIG. 6B is an explanatory diagram illustrating another formation example of the groove for the inner edge ring.

Further, in this case, as illustrated in FIG. 6B, at least three grooves 123a of the conductive ring 123 may be defined by the flat bottom 123a1", a vertical side surface 123a3 which extends downward from the flat bottom 123a1", and a flare-shaped side surface 123a2 which spreads downward from the vertical side surface 123a3.

Figure 6C:
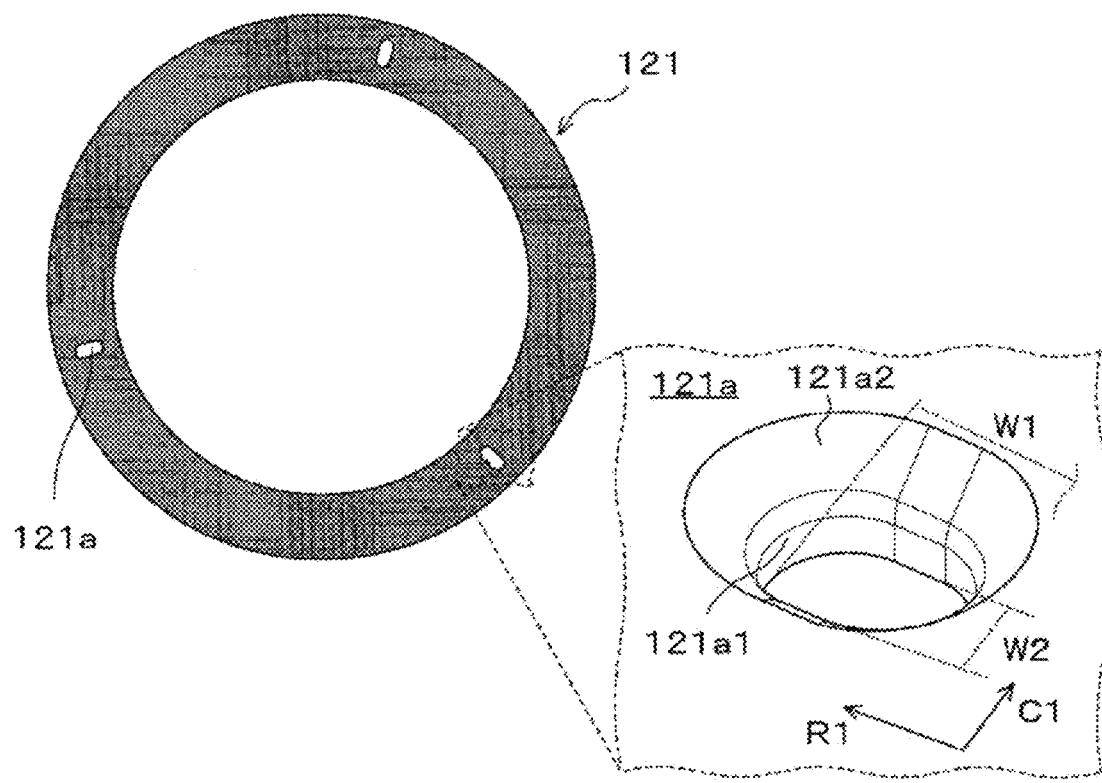
FIG. 6C is an explanatory diagram illustrating another formation example of a through hole for the insulating ring.

Further, for example, in the exemplary embodiment, the through hole 121a formed in the insulating ring 121 is formed in the substantially rectangular shape, and preferably formed in the substantially square shape, but as illustrated in FIG. 6C, the through hole 121a may be formed in the substantially long hole shape in which a round shape of four corners is large. In this case, the through hole 121a having the substantially long hole shape preferably has the long hole shape which has the first width W1 which extends in the radial direction R1 of the insulating ring 121 is larger than the second width W2 which extends in the circumferential direction C1, i.e., has a long-side direction as the radial direction R1 of the insulating ring 121.

<Effects, Etc.>

The plasma processing system according to an exemplary embodiment is configured as above. That is, the plasma processing system according to an exemplary embodiment includes a plasma processing chamber 10, a substrate support 11, an insulting ring 121, a conductive ring 123, at least three lift pins 131, and at least one actuator 132. The substrate support 11 is disposed in the plasma processing chamber 10, and has a substrate supporting surface 110a and a ring supporting surface 110b. The insulating ring 121 is placed on the ring supporting surface 110b, and has at least three through holes 121a. Each of at least three through holes 121a has an upper hole portion 121a1 and a lower hole portion 121a2. The upper hole portion 121a1 has the first width W1 in the radial direction R1 of the insulating ring 121 and the second width W2 in the circumferential direction C1 of the insulating ring 121. The second width W2 is smaller than the first width W1, and the lower hole portion 121a2 has a flare shape which spreads downward when viewed from the side. The conductive ring 123 is supported by the insulating ring 121, and has at least three grooves 123a corresponding to at least three through holes 121a, respectively on the bottom thereof. Each of at least three grooves 123a has the third width W3 in the radial direction R2 of the conductive ring 123 and the fourth width W4 in the circumferential direction C2 of the conductive ring 123. The fourth width W4 is smaller than the third width W3. At least three lift pins 131 are placed below the ring supporting surface 110b, and correspond to at least three grooves 123a, respectively. Each of at least three lift pins 131 has the upper supporting portion 131a and the lower supporting portion 131b. The upper supporting portion 131a is configured to support the conductive ring 123 from downward by contacting the bottom 123a1 of the groove 123a of the conductive ring 123 via the through hole 121a of the insulating ring 121. The lower supporting portion 131b is configured to support the insulating ring 121 from downward by contacting the inclined surface 1211a of the insulating ring 121 defining the lower hole portion 121a2. At least one actuator 132 is configured to move at least three lift pins 131 in the vertical direction. The lower supporting portion 131b of the lift pin 131 is configured to 2-point-contact the inclined surface 1211a in the radial direction R1 of the insulating ring 121 without contacting the inclined surface 1211a in the circumferential direction C1 of the insulating ring 121.

In an exemplary embodiment, each of at least three through holes 121a of the insulating ring 121 has the rectangular shape when viewed from upward. In an exemplary embodiment, the upper supporting portion 131a has a cylindrical shape having a first diameter W5 smaller than the second width W2, and the lower supporting portion 131b has a cylindrical shape having a second diameter W6 larger than the second width W2. In an exemplary embodiment, the tip of the upper supporting portion 131a of the lift pin 131 has the hemispherical shape 131a1. In an exemplary embodiment, the tip of the upper supporting portion 131a of the lift pin 131 has the flat surface 131a2. In an exemplary embodiment, each of at least three grooves 123a of the conductive ring 123 is defined by the flat bottom 123a1", the vertical side surface 123a3 which extends downward from the flat bottom 123a1", and the flare-shaped side surface 123a2 which spreads downward from the vertical side surface 123a3. In an exemplary embodiment, each of at least three grooves 123a of the conductive ring 123 is defined by the curved bottom 123a1'. In an exemplary embodiment, each of at least three grooves 123a of the conductive ring 123 is defined by the flat bottom 123a1" and the flare-shaped side surface 123a2 which spreads downward from the flat bottom 123a1". In an exemplary embodiment, the plasma processing system 1 further includes an additional conductive ring 122 placed to surround around the conductive ring 123 and the insulating ring 121. Further, at least a part of the conductive ring 122 overlaps with an external portion of the insulating ring 121 in the vertical direction.

Further, the plasma processing system according to an exemplary embodiment includes a plasma processing chamber 10, a substrate support 11, a first annular member 121, a second annular member 123, at least three lift pins 131, and at least one actuator 132. The substrate support 11 is placed in the plasma processing chamber 10, and has a substrate supporting surface 110a and a ring supporting surface 110b. The first annular member 121 is placed on the ring supporting surface 110b, and has at least three through holes 121a. Each of at least three through holes 121a has an upper hole portion 121a1 and a lower hole portion 121a2. The upper hole portion 121a1 has a first width W1 in a first direction R1 and a second width W2 in a second direction C1 orthogonal to the first direction R1. The second width W2 is smaller than the first width W1. The lower hole portion 121a2 has the flare shape 1211a which spreads downward when viewed from the side. The second annular member 123 is supported by the first annular member 121, and has at least three grooves 123a corresponding to at least three through holes 121a, respectively on the bottom thereof. Each of at least three grooves 123a has a third width W3 in a third direction R2 and a fourth width W4 in a fourth direction C2 orthogonal to the third direction R2. The fourth width W4 is smaller than the third width W3. At least three lift pins 131 are placed below the ring supporting surface 110b, and correspond to at least three grooves 123a, respectively. Each of at least three lift pins 131 has the upper supporting portion 131a and the lower supporting portion 131b. The upper supporting portion 131a is configured to support the second annular member 123 from downward by contacting the bottom 123a1 of the groove 123a of the second annular member 123 via the through hole 121a of the first annular member 121. The lower supporting portion 131b is configured to support the first annular member 121 from downward by contacting the inclined surface 1211a of the first annular member 121 defining the lower hole portion 121a2. At least one actuator 132 is configured to move at least three lift pins 131 in the vertical direction.

In the plasma processing system, the substrate W is loaded into the plasma processing apparatus 1 by using the transfer apparatus 2, and desired plasma processing such as etching is performed for the loaded substrate W, and then the substrate W is unloaded to the outside of the plasma processing apparatus 1 by using the transfer apparatus 2.

In the exemplary embodiment, the inner edge ring 123 and the outer edge ring are made of a conductive material. Therefore, at the time of the plasma processing in the plasma processing system, a sheath is formed above the ring assembly 120, more specifically, above the inner edge ring 123 as the conductive ring and the outer edge ring 122 as the additional conductive ring. Therefore, an excellent and uniform plasma processing result may be obtained at the center and the periphery of the substrate W held on the substrate support 11.

Here, as described above, in recent years, the plasma processing system, enhancement of installation precision of the ring assembly on the substrate support 11 is required.

In the Japanese Laid-open Patent Publication, it is disclosed that in order to enhance the installation precision of the annular member, the groove formed in the edge ring and the through hole formed in the cover ring are formed to be larger than the transfer precision of the annular member, but in this case, for example, there is a risk that the positioning precision of the annular member will deteriorate when a relative dislocation occurs at positions of the lifter and the groove (through hole) due to a mechanical difference (e.g., processing tolerance) or thermal expansion of the annular member.

In this point, by the plasma processing apparatus 1 according to the technique of the present disclosure, the through hole 121a is formed in the insulating ring 121 corresponding to the cover ring in a substantially rectangular shape in which the first width W1 is larger than the second width W2, and the groove 123a is also formed in the inner edge ring 123 in a substantially long hole shape in which the third width W3 is larger than the fourth width W4.

Therefore, even though the position of the lift pin 131 and the position of the through hole 121a (groove 123a) are dislocated due to the processing tolerance, the insulating ring 121 is slidably movable with the lift pin 131 as an axis, i.e., becomes a free state in the long-side direction of the through-hole 121a (groove 123a), so the insulating ring 121 may be appropriately guided to a desired location. Further, in this case, since the outer edge ring 122 as the additional conductive ring is held on the upper surface of the insulating ring 121, the location of the outer edge ring 122 is simultaneously corrected.

Further, in this case, as described above, the lower supporting portion 131b of the lift pin 131 contacts two points on the inclined portion of the lower hole portion 121a2 of the through hole 121a. As a result, as compared with a case where the lower supporting portion 131b and the inclined portion of the lower hole portion 121a2 are in contact with each other at three points or more, or in line-contact with each other, and in surface-contact with each other, the insulating ring 121 easily slidably moves to more appropriately execute dislocation correction of the insulating ring 121 (ring assembly 120).

Further, in this case, as described above, the upper supporting portion 131a of the lift pin 131 is in line-contact with the bottom 123a1 of the groove 123a.

When the upper supporting portion 131a and the bottom 123a1 of the groove 123a are in contact with each other only at one point or two points, since the upper supporting portion 131a and the bottom 123a1 slidably move relatively easily, the dislocation correction of the inner edge ring 123 may be facilitated, but meanwhile, since the upper supporting portion 131a and the bottom 123a1 slidably move easily, the dislocation of the inner edge ring 123 easily occurs when the lift pin 131 moves in the vertical direction.

Meanwhile, when the upper supporting portion 131a and the bottom 123a1 of the groove 123a are in surface-contact with each other, relative slidable movement of the bottom 123a1 and the upper supporting portion 131a may be suppressed, but meanwhile, since the slidable movement is suppressed, it is difficult to correct the dislocation of the inner edge ring 123.

In this point, in the above exemplary embodiment, since the upper supporting portion 131a of the lift pin 131 is in line-contact with the bottom 123a1 of the groove 123a, the bottom 123a1 slidably moves on the upper supporting portion 131a to appropriately execute the dislocation correction of the inner edge ring 123 and at the same time, the dislocation of the inner edge ring 123 may also be appropriately suppressed when the lift pin 131 moves in the vertical direction.

Further, when the through hole 121a is formed in the insulating ring 121, the through hole having the substantially rectangular shape in which the first width W1 is larger than the second width W2 as such, the insulating ring 121 slidably moves in the long-side direction of the through hole 121a as described above, and as a result, there is a risk that the location of the insulating ring 121 will be dislocated when the lift pin 131 moves in the vertical direction.

By considering such a point, the through hole 121a is preferably formed in the substantially square shape as described above in order to suppress the dislocation of the insulating ring 121 (enhance the placement precision of the insulating ring 121). Further, in this case, the long side-direction width (second width W2) of the through hole 121a is preferably set to a size in which the lower supporting portion 131b of the lift pin 131 contacts the inclined portion of the through hole 121a at two points.

As a result, the lower supporting portion 131b and the inclined portion contact at least two points each other to execute the dislocation correction of the insulating ring 121, and at the same time, a free width of the lift pin 131 in the long-side direction of the through hole 121a decreases to suppress the dislocation of the insulating ring 121 when the lift pin 131 moves in the vertical direction.

<Replacement Method of Ring Assembly>

Next, replacement processing of the ring assembly 120 configured as above will be described by using drawings. Further, the following processing is executed under the control by the controller 3 as an example.

(Step St1: Delivery and Unloading of Inner Edge Ring 123)

First, a consumed inner edge ring 123 to be replaced is delivered to the transfer apparatus 2 from the substrate support 11.

Figure 7:
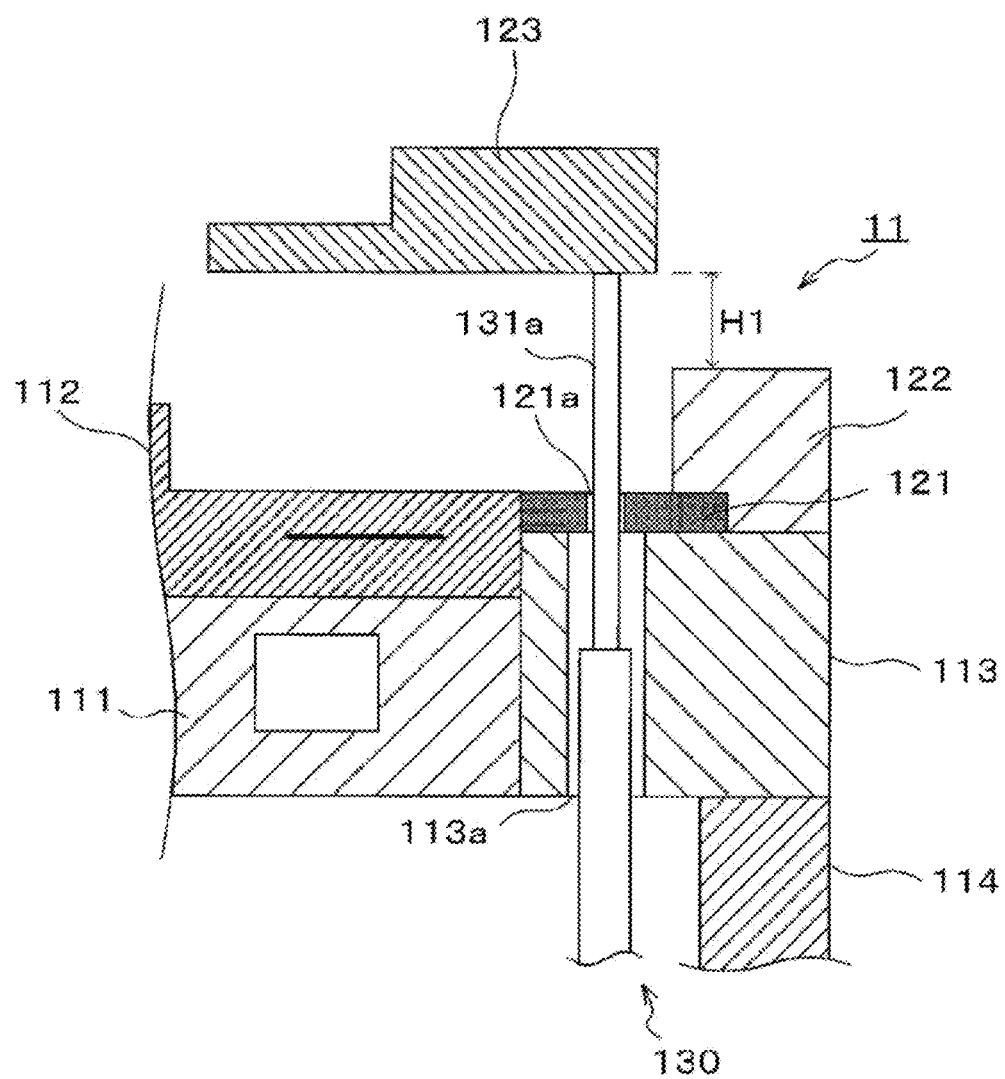
FIG. 7 is a diagram illustrating a form of replacement processing of a ring assembly.

Specifically, first, ascending of the lifter 130 is executed, and as illustrated in FIG. 7, the inner edge ring 123 is delivered to the upper supporting portion 131a of the lifter 130 passing through the through hole 113a of the support 113 and the through hole 121a of the insulating ring 121 from the upper surface of the insulating ring 121. In this case, the ascending of the lifter 130 is executed in a range in which the insulating ring 121 is not delivered by the lower supporting portion 131b, and further, executed until the tip of the upper supporting portion 131a reaches a desired height H1. Here, the desired height H1 is a height of the upper supporting portion 131a of the lifter 130 based on the upper surface of the outer edge ring 122 held on the insulating ring 121 mounted on the support 113. Further, the desired height H1 is a height at which the transfer arm 2a does not interfere with the outer edge ring 122 and the inner edge ring 123 when the transfer arm 2a is inserted and extracted between the outer edge ring 122 on the insulating ring 121 mounted on the support 113 and the inner edge ring 123 supported on the upper supporting portion 131a.

Next, the inner edge ring 123 is unloaded from the plasma processing chamber 10 of the plasma processing apparatus 1.

Specifically, the transfer arm 2a is inserted into the decompressed plasma processing chamber 10 via a loading/unloading port (not illustrated). In addition, the transfer arm 2a moves between the outer edge ring 122 on the insulating ring 121 mounted on the support 113 and the inner edge ring 123 supported on the upper supporting portion 131a of the lifter 130.

Subsequently, descending of the lifter 130 is executed, and the inner edge ring 123 is delivered to the transfer arm 2a from the upper supporting portion 131a of the lifter 130. Next, the transfer arm 2a is extracted from the plasma processing chamber 10, and the inner edge ring 123 itself is unloaded to the outside of the plasma processing apparatus 1. The unloaded inner edge ring 123 is loaded into a receiving module (not illustrated) as an example.

(Step St2: Delivery and Unloading of Insulating Ring 121 and Outer Edge Ring 122)

When the inner edge ring 123 is unloaded from the plasma processing apparatus 1, the consumed insulating ring 121 and outer edge ring 122 to be replaced are subsequently delivered to the transfer apparatus 2 from the substrate support 11.

Figure 8:
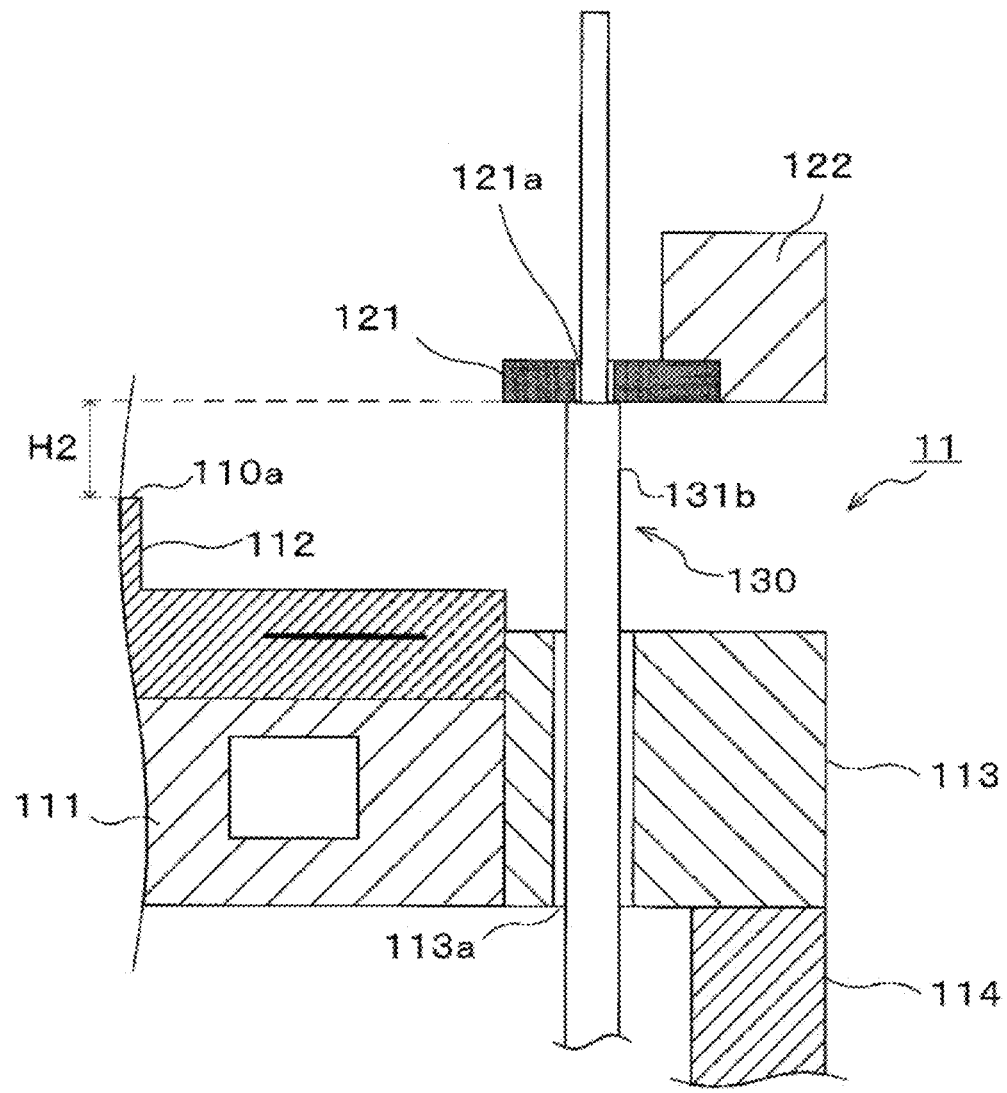
FIG. 8 is a diagram illustrating the form of the replacement processing of the ring assembly.

Specifically, first, the ascending of the lifter 130 is executed, and as illustrated in FIG. 8, the insulating ring 121 is delivered to the lower supporting portion 131b of the lifter 130 passing through the through hole 113a of the support 113 from the upper surface of the annular region 110b (ring supporting surface) of the substrate support 11. In this case, since the outer edge ring 122 is held on the insulating ring 121, the outer edge ring 122 is also delivered by the lower supporting portion 131b via the insulating ring 121. In this case, the ascending of the lifter 130 is executed until the step of the lower supporting portion 131b reaches a desired height H2. Here, the desired height H2 is a height of the lower supporting portion 131b of the lifter 130 based on the upper surface (more specifically, the upper surface of the electrostatic chuck 112) of the substrate support 11. Further, the desired height H2 is a height at which the transfer arm 2a does not interfere with the insulating ring 121 and the electrostatic chuck 112 when the transfer arm 2a is inserted and extracted between the electrostatic chuck 112 and the insulating ring 121 supported on the lower supporting portion 131b.

Next, the insulating ring 121 and the outer edge ring 122 are unloaded from the plasma processing chamber 10 of the plasma processing apparatus 1.

Specifically, the transfer arm 2a is inserted into the decompressed plasma processing chamber 10 via a loading/unloading port (not illustrated). In addition, the transfer arm 2a moves between the electrostatic chuck 112, and the insulating ring 121 supported on the lower supporting portion 131b of the lifter 130.

Subsequently, the descending of the lifter 130 is executed, and the insulating ring 121 and the outer ring 122 are delivered to the transfer arm 2a from the lower supporting portion 131b of the lifter 130. Next, the transfer arm 2a is extracted from the plasma processing chamber 10, and the insulating ring 121 and the outer edge ring 122 are unloaded to the outside of the plasma processing apparatus 1. The unloaded insulating ring 121 and the outer edge ring 122 are loaded into a receiving module (not illustrated) as an example.

(Step St3: Loading and Mounting of Ring Assembly 120)

When the inner edge ring 123, the insulating ring 121, and the outer edge ring 122 are unloaded from the plasma processing apparatus 1, a new ring assembly 120 (the insulating ring 121, the outer edge ring 122, and the inner edge ring 123) for replacement are subsequently loaded into the plasma processing apparatus 1.

Figure 9:
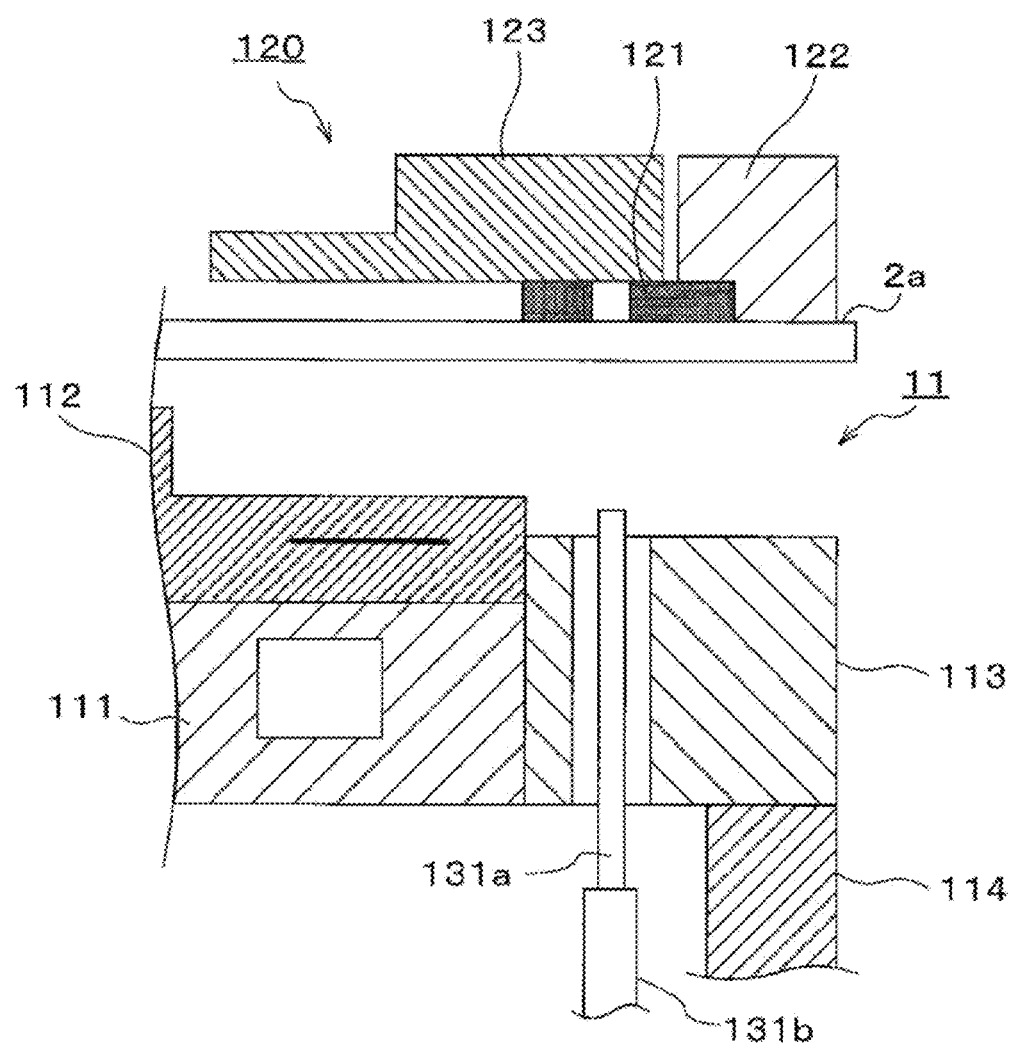
FIG. 9 is a diagram illustrating the form of the replacement processing of the ring assembly.

Specifically, the transfer arm 2a of the transfer apparatus 2, which holds the new ring assembly 120 including the insulating ring 121, and the outer edge ring 122 and the inner edge ring 123 held on the insulating ring 121 is inserted into the plasma processing chamber 10 via the loading/unloading port (not illustrated). In this case, the plasma processing chamber 10 may be decompressed. In addition, as illustrated in FIG. 9, the new ring assembly 120 is transferred by the transfer arm 2a above the annular region 110b of the substrate support 11.

Next, the new ring assembly 120 is mounted on the annular region 110b of the substrate support 11 from the transfer apparatus 2.

Figure 10A:
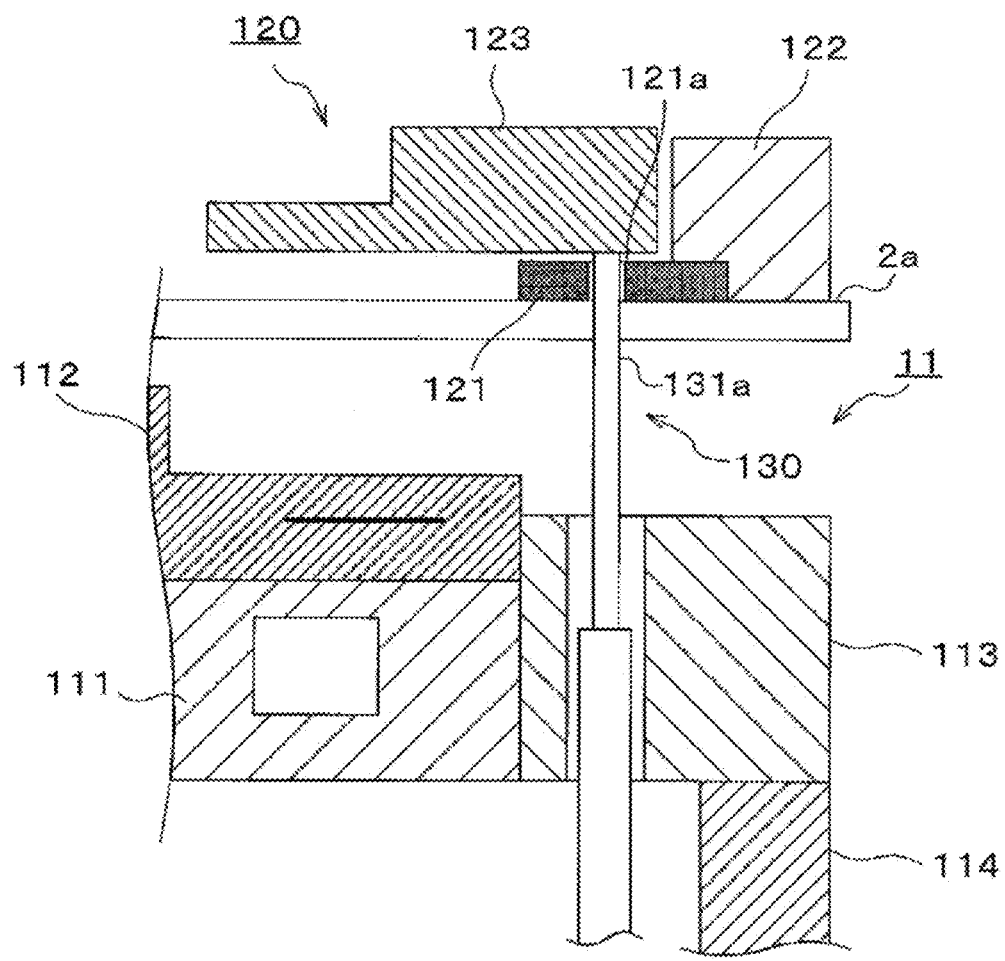
FIG. 10A is a diagram illustrating the form of the replacement processing of the ring assembly.

Specifically, the ascending of the lifter 130 is executed, and as illustrated in FIG. 10A, the inner edge ring 123 is delivered to the upper supporting portion 131a of the lifter 130 passing through the through hole 121a of the insulating ring 121 from the upper surface of the insulating ring 121 held on the transfer arm 2a.

In this case, in the through hole 121a of the insulating ring 121 and the groove 123a of the inner edge ring 123, as described above, the lower end of the inclined portion is formed to be at least larger than the transfer precision of the inner edge ring 123 by the transfer apparatus 2. As a result, even though the lift pin 131, the through hole 121a, and the groove 123a are dislocated due to the transfer precision of the transfer apparatus 2, the lift pin 131 is appropriately inserted into the through hole 121a to be further guided to the bottom 123a1 of the groove 123a.

Figure 10B:
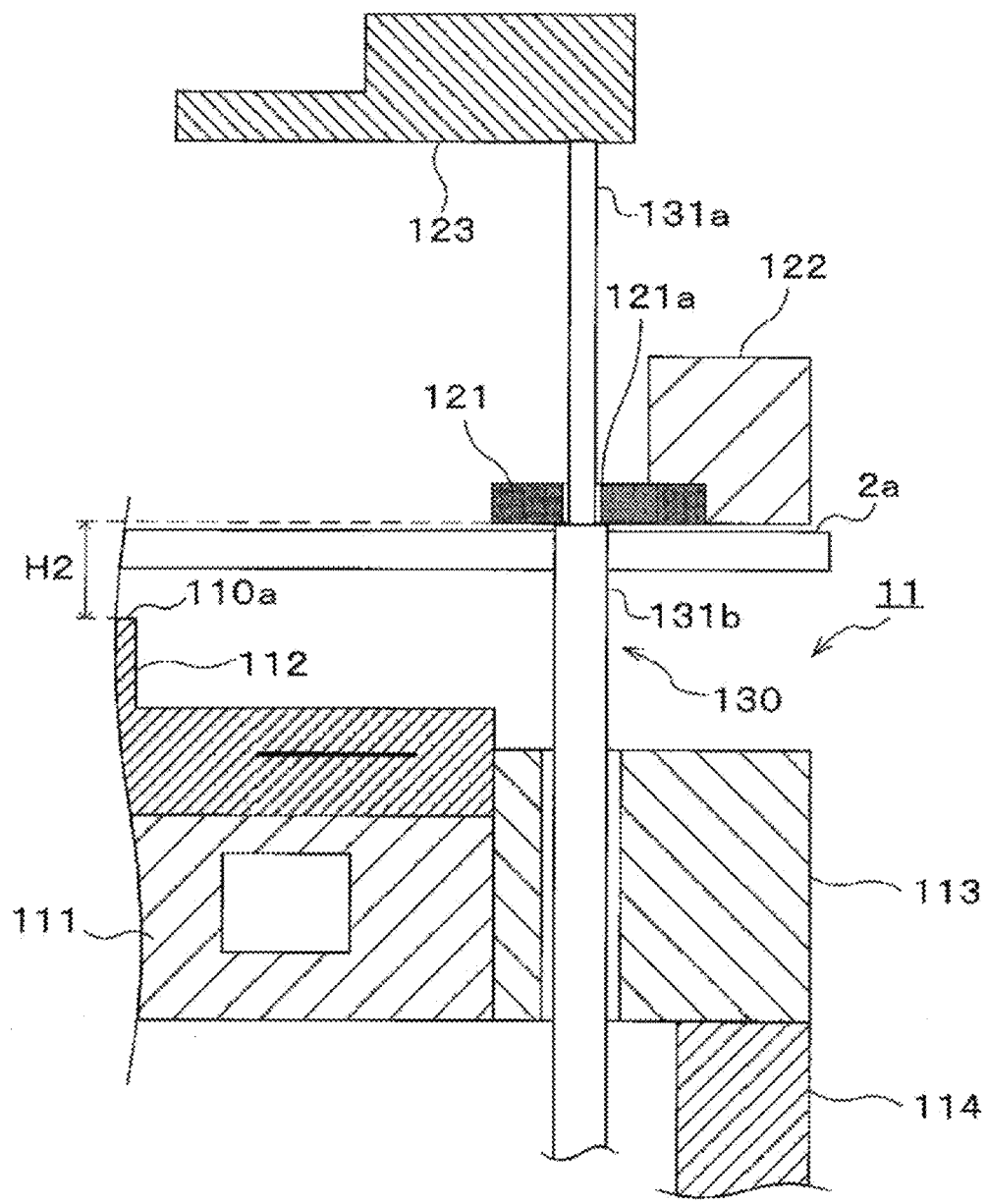
FIG. 10B is a diagram illustrating the form of the replacement processing of the ring assembly.

Subsequently, the ascending of the lifter 130 is continued, and the insulating ring 121 is delivered to the lower supporting portion 131b of the lifter 130 from the transfer arm 2a as illustrated in FIG. 10B. In this case, the outer edge ring 122 on the insulating ring 121 is also simultaneously delivered to the lower supporting portion 131b. In this case, the ascending of the lifter 130 is executed until the step of the lower supporting portion 131b reaches a desired height H2.

In this case, in the exemplary embodiment, in the through hole 121a of the insulating ring 121 and the groove 123a of the inner edge ring 123, a diameter-direction width (a first width W1 or a third width W3) is larger a circumferential width (a second width W2 or a fourth width W4). As a result, even though the lift pin 131, the through hole 121a, and the groove 123a are dislocated due to the processing tolerance, the lift pin 131 is appropriately inserted into the through hole 121a to be further guided to the bottom 123a1 of the groove 123a.

Further, in this case, the lower supporting portion 131b of the lift pin 131 contacts the inclined portion of the through hole 121a at two points, and as a result, the insulating ring 121 becomes a free state in the long-side direction of the through hole 121a with the lift pin 131 as the axis. As a result, even though the lift pin 131, the through hole 121a, and the groove 123a are dislocated due to various causes, the insulating ring 121 slidably moves in the long-side direction of the through hole 121a to appropriately position the insulating ring 121 and the outer edge ring 122 at desired locations.

Further, similarly, the upper supporting portion 131a of the lift pin 131 is in line-contact with the bottom 123a1 of the groove 123a, and as a result, the inner edge ring 123 may be appropriately positioned at a desired location, and at the same time, the dislocation of the inner edge ring 123 at the time of subsequent mounting of the ring assembly 120 may be suppressed.

Next, extraction of the transfer arm 2a from the plasma processing chamber 10 is executed. Further, the descending of the lifter 130 is executed. As a result, the insulating ring 121, the outer edge ring 122, and the inner edge ring 123 are mounted on the upper surface of the annular region 110b of the substrate support 11 and the upper surface of the support 113. Specifically, first, the insulating ring 121 and the outer edge ring 122 are mounted on the upper surface of the support 113, and next, the inner edge ring 123 is mounted on the upper surface of the insulating ring 121 and the upper surface of the annular region 110b of the substrate support 11.

Therefore, a series of processing for mounting the ring assembly 120 on the substrate support 11 is completed.

Further, in the exemplary embodiment, loading and mounting of the insulating ring 121, the outer edge ring 122, and the inner edge ring 123 as the ring assembly 120 are simultaneously executed, but loading and mounting of any one of the insulating ring 121, the outer edge ring 122, and the inner edge ring 123 may be independently executed.

Further, in the exemplary embodiment, delivery and unloading of the insulating ring 121, the outer edge ring 122, and the inner edge ring 123 as the ring assembly 120 are sequentially executed, but delivery and unloading of any one of the insulating ring 121, the outer edge ring 122, and the inner edge ring 123 may be simultaneously executed. In this case, in a state in which the inner edge ring 123 is mounted on the insulating ring 121, i.e., the delivery between the lift pin 131 and the transfer arm 2a and unloading from the plasma processing apparatus 1 may be executed integrally with the insulating ring 121.

<Modified Example of Edge Ring>

Figure 11A:
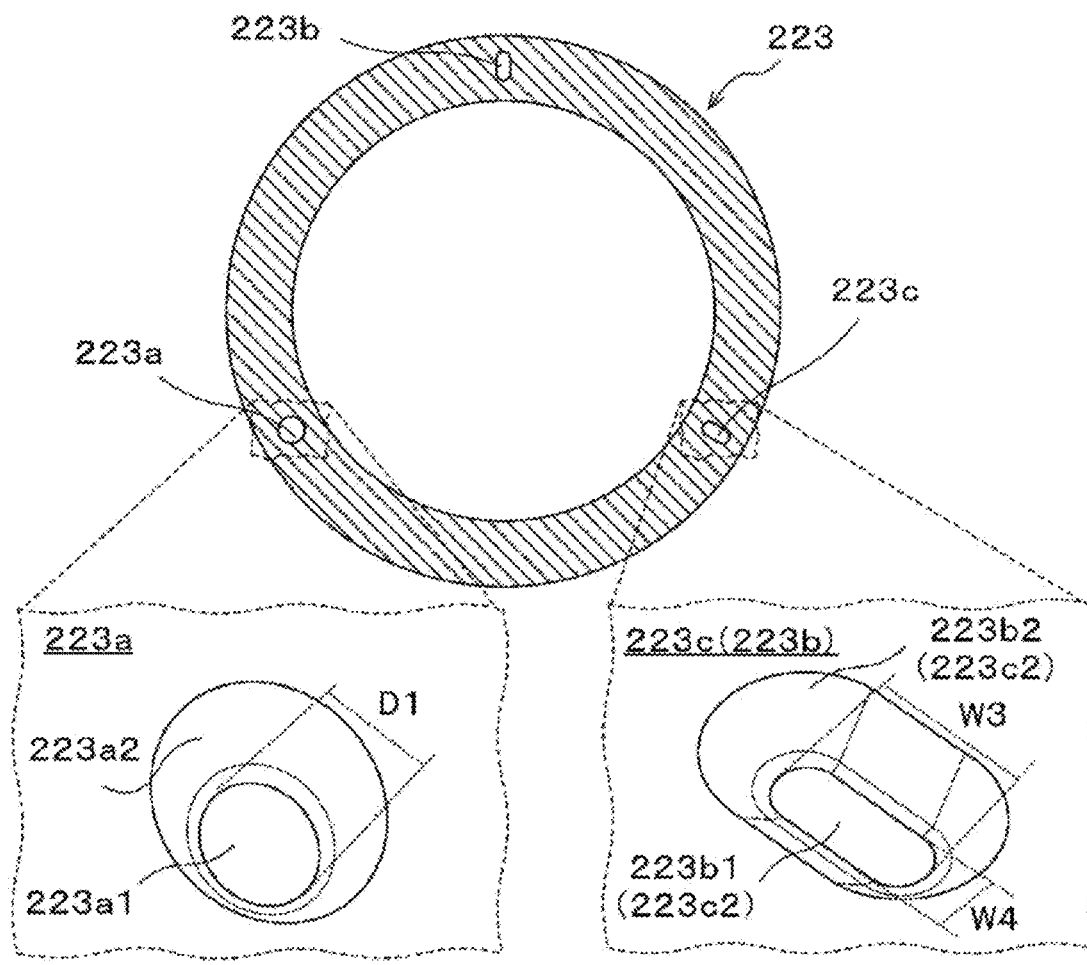
FIG. 11A is a diagram illustrating another configuration example of the inner edge ring.
Figure 11B:
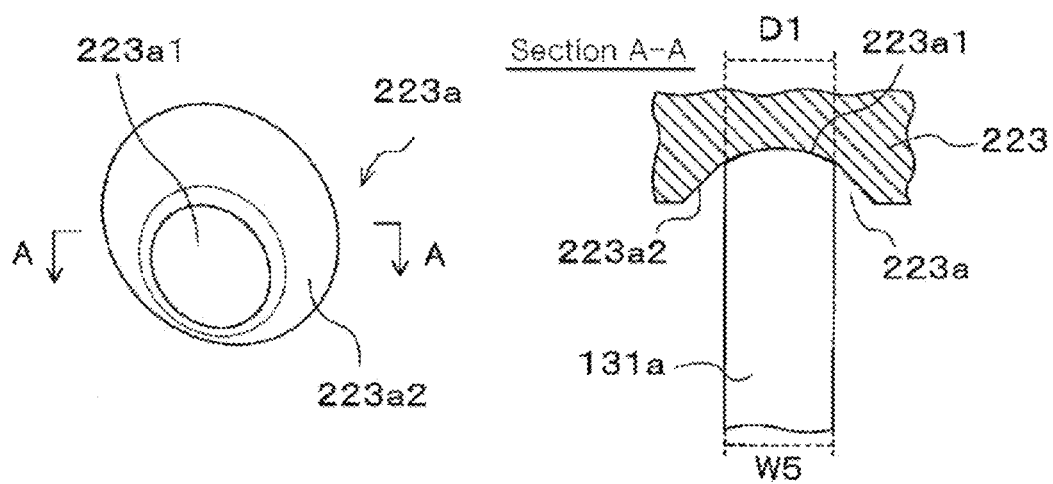
FIG. 11B is a diagram illustrating another configuration example of the inner edge ring.
Figure 11C:
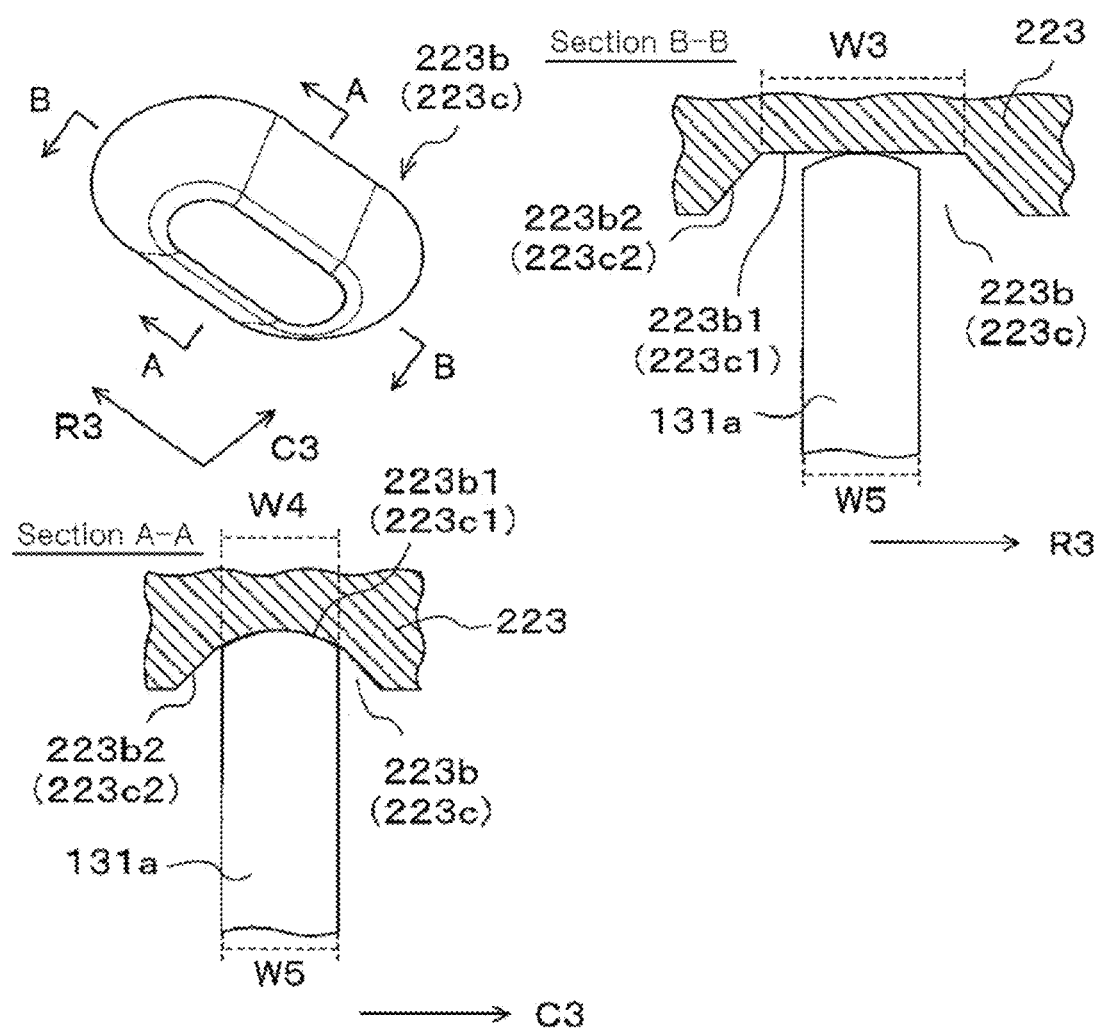
FIG. 11C is a diagram illustrating another configuration example of the inner edge ring.

FIGS. 11A to 11C are diagrams illustrating a configuration example of an inner edge ring 223 according to another exemplary embodiment.

In the inner edge ring 223 according to another exemplary embodiment, among a plurality of, in the illustrated example, three grooves 223a to 223c formed on the bottom, at least one groove (a groove 223a in the illustrated example) may be formed in a circular shape (FIG. 11B) and the remaining grooves (grooves 223b and 223c in the illustrated example) may be formed in a long hole shape (FIG. 11C).

In an exemplary embodiment, the groove 223a having the circular shape has the substantially same diameter (a first diameter D1 of FIGS. 11A and 11B) as the width (fifth width W5) of the upper supporting portion 131a of the lift pin 131 on a bottom 223a1. Further, the bottom 223a1 of the groove 223a has a shape of being fitted into a tip shape of the upper supporting portion 131a of the lift pin 131. In other words, the tip of the upper supporting portion 131a is configured to be in surface-contact with the groove 223a1 of the groove 223a formed in the inner edge ring 223.

Further, a side surface 223a2 of the groove 223a has an inclined portion is so that the first diameter D1 of the bottom 223a1 spreads downward (toward the bottom of the inner edge ring 223). A lower end of the inclined portion of the groove 223a is preferably formed to be at least larger than the transfer precision of the inner edge ring 223 by the transfer apparatus 2.

In an exemplary embodiment, the grooves 223b and 223c having the long hole shape have the same structure as the groove 123a of the inner edge ring 123 illustrated as the exemplary embodiment. That is, the grooves 223b and 223c are formed in which a third width W3 which extends in the radial direction of the inner edge ring 223 is larger than a fourth width W4 which extends in the circumferential direction of the inner edge ring 223 orthogonal to the radial direction, and bottoms 223b1 and 223c1 have, in particular, a shape of being fitted into the tip shape of the upper supporting portion 131a of the lift pin 131 in an extension direction of the fourth width W4. Further, the inclined portions are formed on side surfaces 223b2 and 223c2 of the grooves 223b and 223c. A lower end of the inclined portion of the groove 123a is preferably formed to be at least larger than the transfer precision of the inner edge ring 123 by the transfer apparatus 2.

As illustrated as the exemplary embodiment, when all of three grooves 123a formed on the bottom of the inner edge ring 123 have the long hole shape, the inner edge ring 123 becomes the free state in the long-side direction of the groove 123a as described above, so there is a risk that the inner edge ring 123 slidably moves to be dislocated.

Therefore, in the inner edge ring 223 according to another exemplary embodiment, at least one groove 223a is formed in the circular shape, and positioning of the inner edge ring 23 is executed based on the circular groove 223a. That is, the plasma processing system according to an exemplary embodiment includes a plasma processing chamber 10, a substrate support 11, an annular member 223, at least three lift pins 131, and at least one actuator 132. The substrate support 11 is placed in the plasma processing chamber 10, and has a substrate supporting surface 110a and a ring supporting surface 110b. The annular member 223 is placed on the ring supporting surface 110b, and has at least three grooves 223a to 223c. A first groove 223a among at least three grooves 223a to 223c has the circular bottom 223a when viewed from upward. A second groove 223b and a third groove 223c among at least three grooves 223a to 223c have the bottoms 223b1 and 223c1 having a first width W3 in a radial direction R3 of the annular member 223 and a second width W4 in a circumferential direction C3 of the annular member 223. The second width W4 is smaller than the first width W3. At least three cylindrical lift pins 131 are placed below the ring supporting surface 110b, and correspond to at least three grooves 223a to 223c, respectively. At least three cylindrical lift pins 131 are configured to support the annular member 223 from downward by contacting the bottoms of the grooves 223a to 223c of the annular member 223, respectively. At least one actuator 132 is configured to move at least three cylindrical lift pins 131 in the vertical direction.

Therefore, the tip of the upper supporting portion 131a and the bottom 223a1 of the groove 223a having the substantially same size are fitted to be in surface-contact with each other, so the inner edge ring 223 and the lifter 130 are at least suppressed from slidably moving in a horizontal direction. Further, since the remaining grooves 223b and 223c are formed in the long hole shape, even though the grooves 223b and 223c, and the lift pin 131 are dislocated due to various causes, the lift pin 131 may be appropriately guided to the grooves 223b and 223c by correcting the dislocation and the inner edge ring 223 may be positioned at a desired location.

Further, in the exemplary embodiment, among at least three grooves 223a to 223c, one groove 223a is formed in the circular shape, and the remaining grooves 223b and 223c are formed in the long hole shape, but for example, when the positioning of the inner edge ring 223 may be appropriately executed, each of at least three grooves 223a to 223c may be formed in the circular shape.

In other words, in an exemplary embodiment, each of at least three grooves 223a to 223c of the conductive ring 123 is defined by the bottom 223a1 having a shape to be fitted into the tip of the upper supporting portion 131a of the lift pin 131 and the flare-shaped side surface 223a2 which spreads downward from downward surface.

<Modified Example of Groove Formed in Inner Edge Ring>

Further, sectional shapes of long hole shaped grooves (the groove 123a of the inner edge ring 123 and the grooves 223b and 223c of the inner edge ring 223) formed in the inner edge ring are not limited to the exemplary embodiment.

Figure 12A:
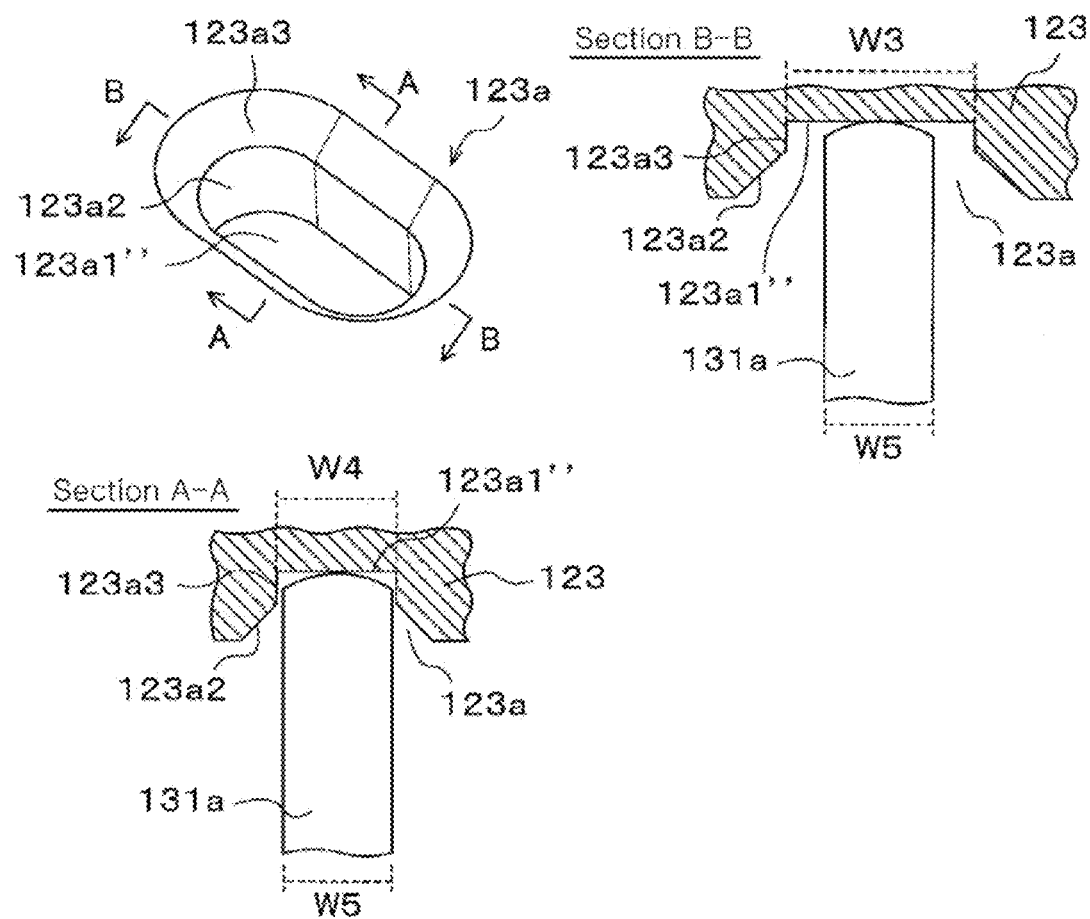
FIG. 12A is an explanatory diagram illustrating another formation example for the groove for the inner edge ring.

For example, as illustrated in FIG. 12A, the groove 123a may have the bottom 123a1", the vertical side surface 123a3 as a vertical wall which extends vertically downward from the flat bottom 123a1", and the flare-shaped side surface 123a2 as extended wall which spreads downward from the vertical side surface 123a3. In this case, a short side-direction fourth width W4 (a width of the vertical wide surface 123a3 part) of the groove 123a is preferably formed to be a little larger than the diameter (the fifth width W5) of the upper supporting portion 131a to slidably move with respect to the lift pin 131. In this case, a contact scheme of the upper supporting portion 131a and the groove 123a is a 1-point contact.

Figure 12B:
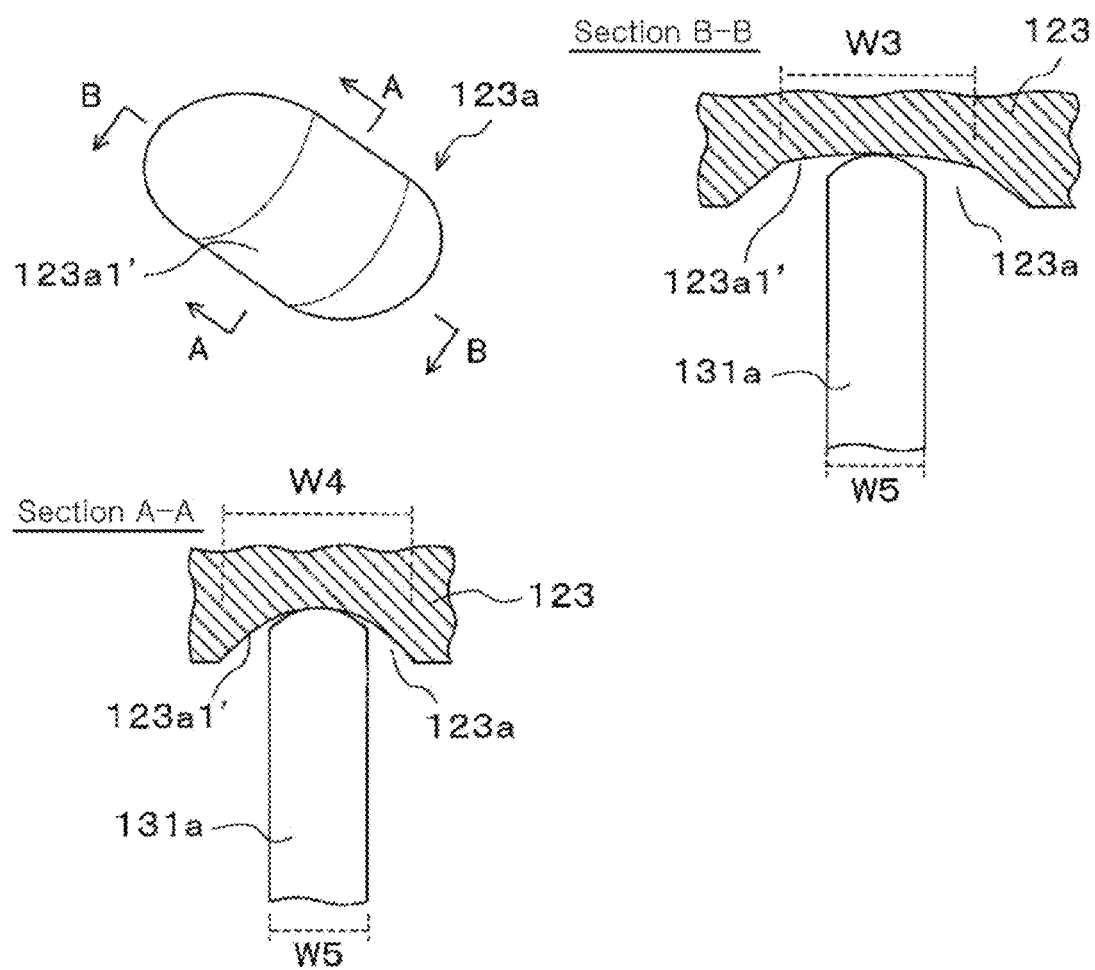
FIG. 12B is an explanatory diagram illustrating another formation example of the groove for the inner edge ring.

For example, as illustrated in FIG. 12B, the groove 123a may be formed on a curved surface having a larger curvature than the tip (hemispherical shape 131a1) of the hemispherical lift pin 131. In other words, the groove 123a has only the curved bottom 123a1' having the curved shape, and may not include the vertical side surface 123a3 and the flare-shaped side surface 123a2. In this case, the groove 123a is configured to slidably move with respect to the lift pin 131. In this case, the contact scheme of the upper supporting portion 131a and the groove 123a is the 1-point contact.

Figure 12C:
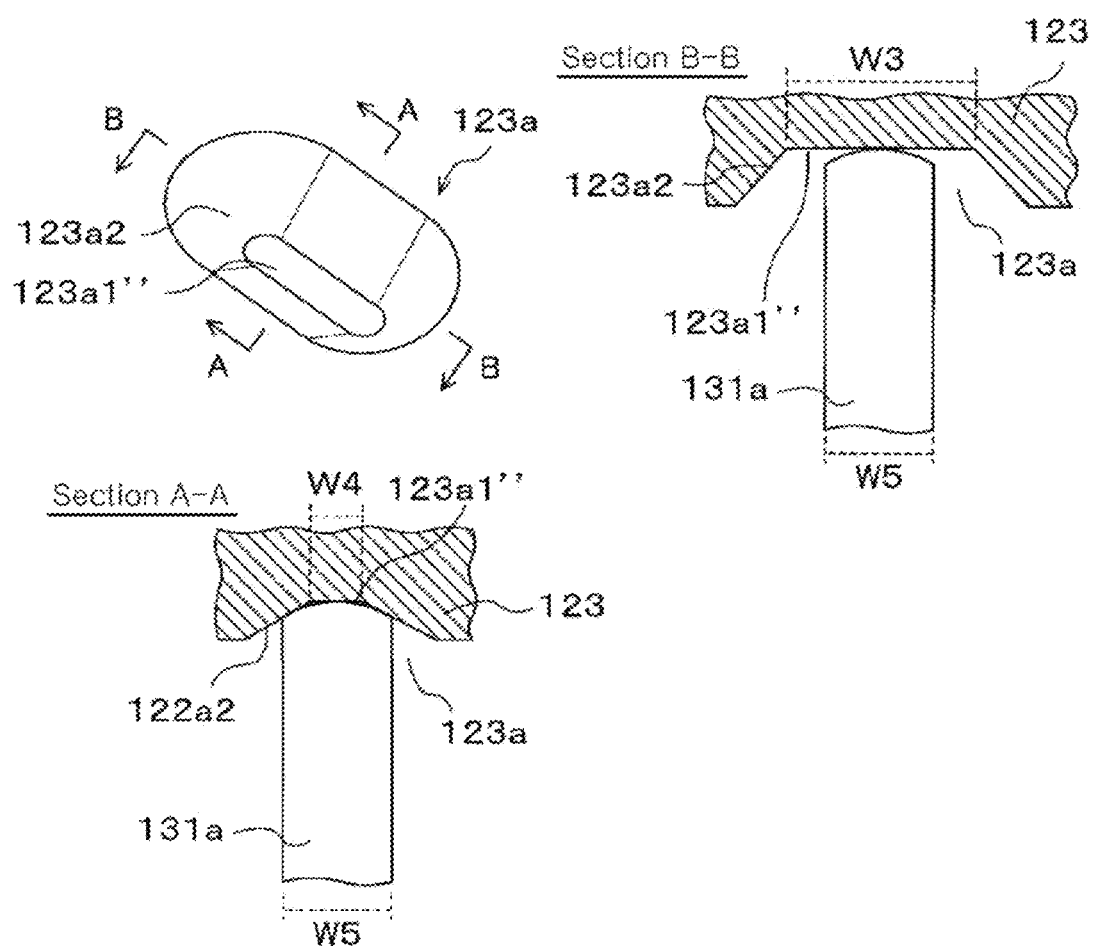
FIG. 12C is an explanatory diagram illustrating another formation example of the groove for the inner edge ring.

For example, as illustrated in FIG. 12C, the groove 123a may have the bottom 123a1" having the substantially flat surface and the flare-shaped side surface 123a2 as the extended wall which spreads downward from the flat bottom 123a1". In other words, as compared with the exemplary embodiment, in the example illustrated in FIG. 12C, the flat bottom 123a1" is not formed in a shape of being fitted into the lift pin 131. In this case, the contact scheme of the upper supporting portion 131a and the groove 123a is a 3-point contact.

Further, in the examples illustrated in FIGS. 5 and FIGS. 12A to 12C above, the flare-shaped side surface 123a2 which spread downward from downward surface 123a1 (or vertical side surface 123a3) of the groove 123a is configured by a side surface having a liner shape when viewed form the side, which spreads at a predetermined ratio downward, but the flare-shaped side surface 123a2 may be configured by the side surface having the curved shape when viewed from the side.

Figure 12D:
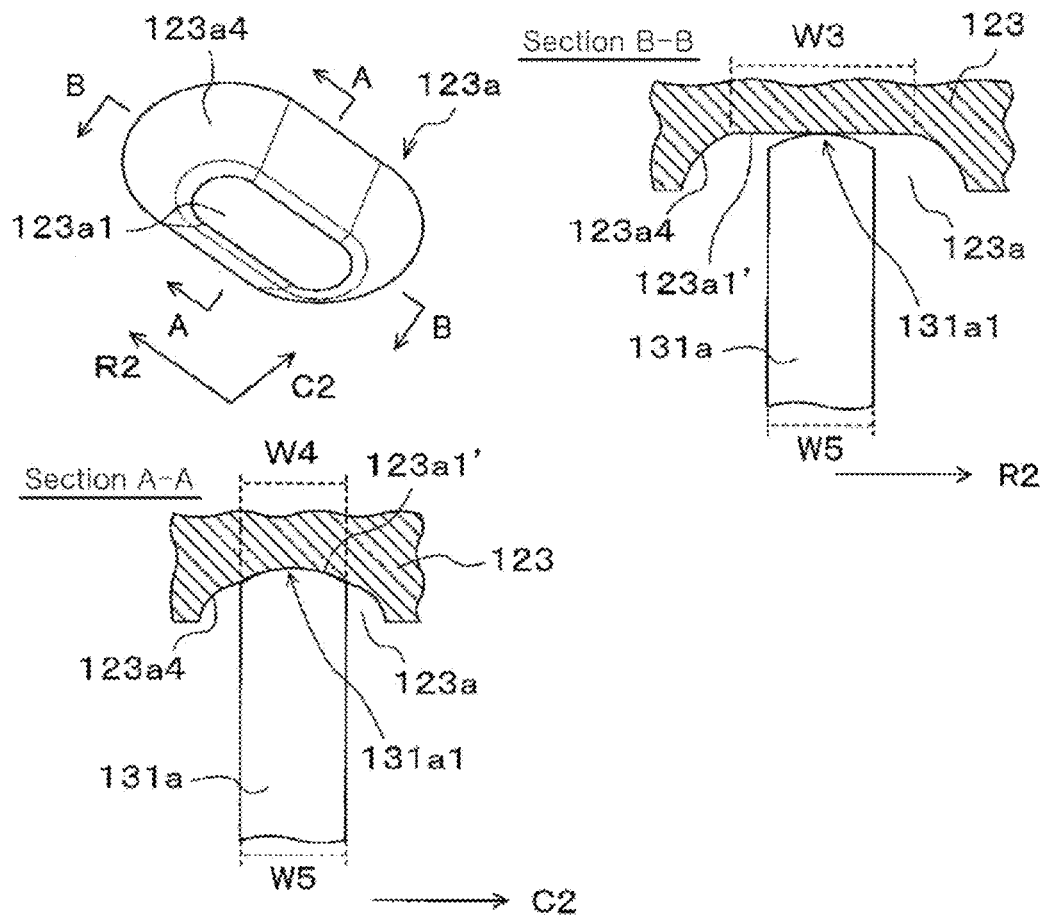
FIG. 12D is an explanatory diagram illustrating another formation example of the groove for the inner edge ring.

Specifically, as illustrated in FIG. 12D as an example, the groove 123a may have a curved bottom 123a1' having the curved shape, which has a larger curvature than the tip (hemispherical shape 131a1) of the hemispherical lift pin 131, and a flare-shaped curved side surface 123a4 which spreads downward from the curved bottom 123a1' and which is curved upward (toward an opposite side to the lift pin 131). In this case, the contact scheme of the upper supporting portion 131a and the groove 123a is the 1-point contact.

Further, the curvature of the flare-shaped curved side surface 123a4 is not particularly limited. In other words, the groove 123a is formed in the inner edge ring 123 provided in the plasma processing apparatus 1 according to the technique of the present disclosure, and the groove 123a is constituted by the bottom 123a1, and one or more side surfaces (side surfaces 123a2, 123a3, and 123a4) having a predetermined curvature of "0" or more. The curvature of side surface being "0" refers to the side surface being the linear shape (side surface 123a2) when viewed from the side. The curvature being larger than "0" refers to the side surface being the curved shape (side surface 123a4) when viewed from the side.

As such, the groove 123a (grooves 223b and 223c) may be formed in a predetermined sectional shape. In this case, the contact scheme of the upper supporting portion 131a and the groove 123a varies depending on the sectional shape. From a viewpoint of facilitating the positioning of the upper supporting portion 131a and the groove 123a, a contact area of the upper supporting portion 131a and the groove 123a is preferably small. From a viewpoint of enhancing the installation precision of the upper supporting portion 131a and the groove 123a, the contact area of the upper supporting portion 131a and the groove 123a is preferably large.

As such, the sectional shape of the groove 123a (grooves 223b and 223c) may be appropriately designed according to a purpose.

Further, the sectional shape of the circular groove (the groove 223a of the inner edge ring 223) formed in the inner edge ring is not also limited to the exemplary embodiment.

Figure 13A:
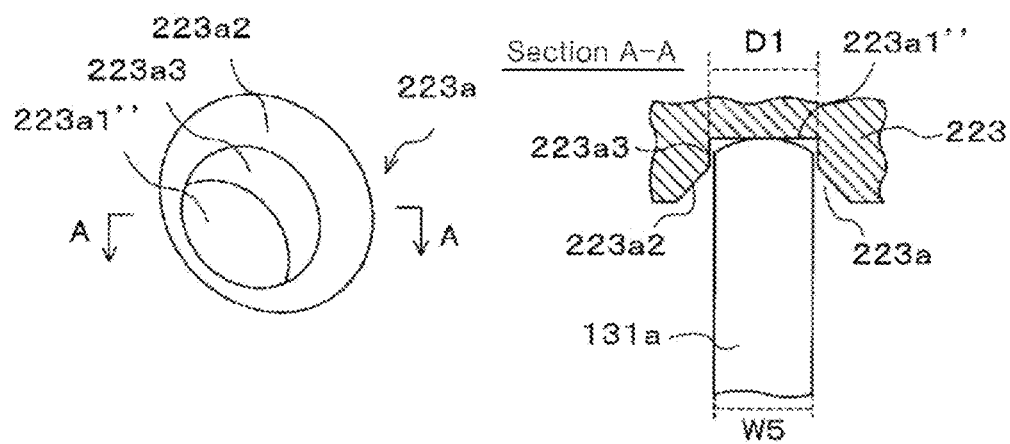
FIG. 13A is an explanatory diagram illustrating another formation example for the groove for the inner edge ring.

For example, as illustrated in FIG. 13A, the groove 223a may have a bottom 223a1", a vertical side surface 223a3 as a vertical wall which extends vertically downward from the flat bottom 223a1", and a flare-shaped side surface 223a2 as extended wall which spreads downward from the vertical side surface 223a3. In this case, a first diameter D1 (a width of the vertical side surface (223a3) part) of the groove 223a is preferably formed to be a little larger than the diameter (fifth width W5) of the upper supporting portion 131a in order to appropriately contact the tip of the lift pin 131 with the flat bottom 223a1". Further, in this case, the contact scheme of the upper supporting portion 131a and the groove 123a is the 1-point contact.

Figure 13B:
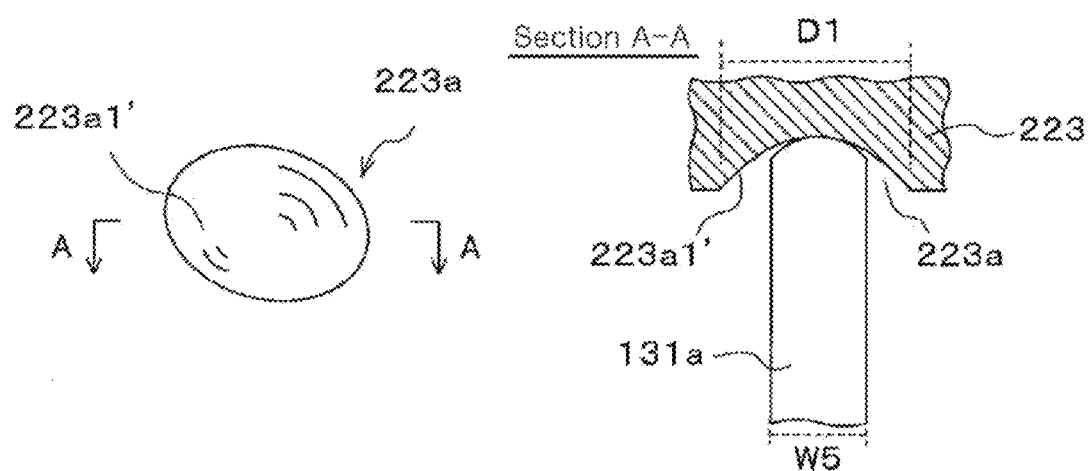
FIG. 13B is an explanatory diagram illustrating another formation example of the groove for the inner edge ring.

For example, as illustrated in FIG. 13B, the groove 223a may be formed on a curved surface having a larger curvature than the tip of the hemispherical lift pin 131. In other words, the groove 223a has only the curved bottom 223a1' having the curved shape, and may not include the flare-shaped side surface 223a2 and the vertical side surface 223a3. In this case, the contact scheme of the upper supporting portion 131a and the groove 223a is the 1-point contact.

Figure 13C:
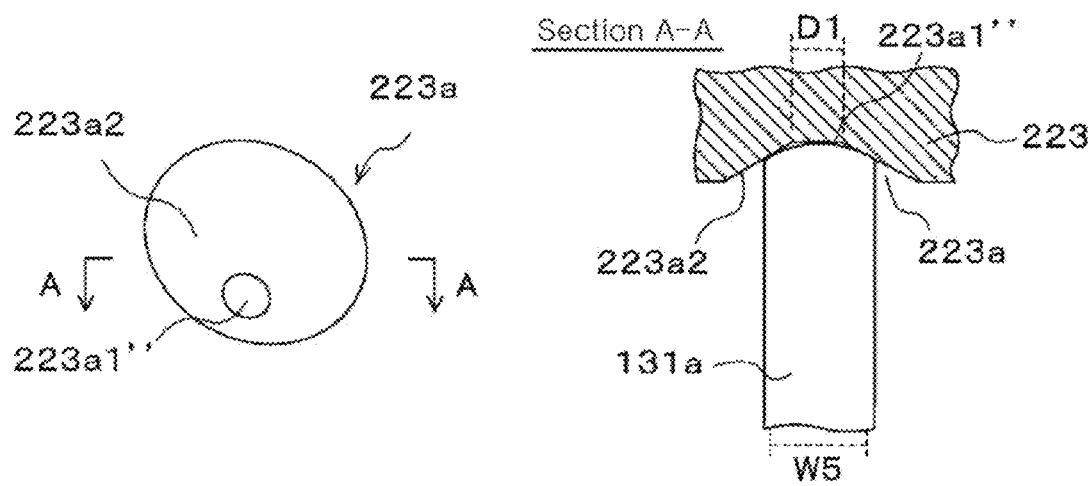
FIG. 13C is an explanatory diagram illustrating another formation example of the groove for the inner edge ring.

For example, as illustrated in FIG. 13C, the groove 223a may have the bottom 223a1" having the substantially flat surface and the flare-shaped side surface 223a2 as the extended wall which spreads downward from the flat bottom 223a1". In other words, as compared with the example illustrated in FIG. 11, in the example illustrated in FIG. 13C, the flat bottom 223a1" is not formed in a shape of being fitted into the lift pin 131. In this case, the contact scheme of the upper supporting portion 131a and the groove 223a is the 3-point contact.

Further, the illustrated is omitted, but even for the circular groove 223a, similarly to the example illustrated in FIG. 12D, the flare-shaped side surface 123a2 may be configured by the curve-shaped side surface when viewed from the side. In other words, the circular groove 223a may have a flare-shaped curved side surface not illustrated.

Hereinabove, various exemplary embodiments have been described, but the present disclosure is not limited to the exemplary embodiment, but various additions, omissions, substitutions, and modifications may be made. Further, it is possible to form another exemplary embodiment by combining elements in different exemplary embodiments.

The invention claimed is:

1. A plasma processing apparatus, comprising:
   a plasma processing chamber;
   a substrate support disposed in the plasma processing chamber, the substrate support having a substrate supporting surface and a ring supporting surface;
   an insulating ring disposed on the ring supporting surface, the insulating ring having at least three through holes, each of the at least three through holes having an upper hole portion and a lower hole portion, the upper hole portion having a first width in a radial direction of the insulating ring and a second width in a circumferential direction of the insulating ring, the second width being smaller than the first width, the lower hole portion having a flaring shape spreading downward when viewed from a side;
   a conductive ring supported by the insulating ring, the conductive ring having at least three grooves on a lower surface, the at least three grooves corresponding to the at least three through holes, respectively, each of the at least three grooves having a third width in a radial direction of the conductive ring and a fourth width in a circumferential direction of the conductive ring, the fourth width being smaller than the third width;
   at least three lift pins disposed below the ring supporting surface, the at least three lift pins corresponding to the at least three grooves, respectively, each of the at least three lift pins having an upper supporting portion and a lower supporting portion, the upper supporting portion being configured to support the conductive ring from downward by contacting a bottom of the groove of the conductive ring through the through hole of the insulating ring, the lower supporting portion being configured to support the insulating ring from downward by contacting an inclined surface of the insulating ring, the inclined surface defining the lower hole portion; and
   at least one actuator configured to vertically move the at least three lift pins.

2. The plasma processing apparatus of claim 1, wherein the lower supporting portion of the lift pin is configured to come into contact with two points on the inclined surface in the radial direction of the insulating ring without contacting the inclined surface in the circumferential direction of the insulating ring.

3. The plasma processing apparatus of claim 1, wherein each of the at least three through holes of the insulating ring has a rectangular shape when viewed from upward.

4. The plasma processing apparatus of claim 1, wherein the upper supporting portion has a cylindrical shape having a first diameter smaller than the second width, and the lower supporting portion has a cylindrical shape having a second diameter larger than the second width.

5. The plasma processing apparatus of claim 1, wherein a tip of the upper supporting portion of the lift pin has a hemispherical shape.

6. The plasma processing apparatus of claim 1, wherein a tip of the upper supporting portion of the lift pin has a flat surface.

7. The plasma processing apparatus of claim 1, wherein each of the at least three grooves of the conductive ring is defined by:
   a flat bottom,
   a vertical side surface which extends downward from the flat bottom, and
   a flare-shaped side surface which spreads downward from the vertical side surface.

8. The plasma processing apparatus of claim 1, wherein each of the at least three grooves of the conductive ring is defined by a curved bottom.

9. The plasma processing apparatus of claim 1, wherein each of the at least three grooves of the conductive ring is defined by:
   a flat bottom, and
   a flare-shaped side surface which spreads downward from the flat bottom.

10. The plasma processing apparatus of claim 1, wherein each of the at least three grooves of the conductive ring has a bottom having a shape to be fitted into a tip of the upper supporting portion of the lift pin, and a flare-shaped side surface which spreads downward from the bottom.

11. The plasma processing apparatus of claim 1, further comprising:
   an additional conductive ring disposed to surround a circumstance of the conductive ring and the insulating ring,
   wherein at least a part of the additional conductive ring overlaps an outer portion of the insulating ring in a vertical direction.

12. A plasma processing apparatus, comprising:
   a plasma processing chamber;
   a substrate support disposed in the plasma processing chamber, the substrate support having a substrate supporting surface and a ring supporting surface;
   an annular member disposed on the ring supporting surface, the annular member having at least three grooves on a lower surface, a first groove among the at least three grooves having a circular bottom when viewed from upward, a second groove and a third groove among the at least three grooves having a bottom having a first width in a radial direction of the annular member and a second width in a circumferential direction of the annular member, the second width being smaller than the first width;

at least three cylindrical lift pins disposed below the ring supporting surface, the at least three cylindrical lift pins corresponding to the at least three grooves, respectively, each of the at least three cylindrical lift pins being configured to support the annular member from downward by contacting the bottom of the groove of the annular member; and at least one actuator configured to vertically move the at least three cylindrical lift pins.

13. The plasma processing apparatus of claim 12, wherein a tip of the cylindrical lift pin has a hemispherical shape.

14. The plasma processing apparatus of claim 12, wherein a tip of the cylindrical lift pin has a flat surface.

15. The plasma processing apparatus of claim 12, wherein each of the at least three grooves of the annular member is defined by:
   a flat bottom,
   a vertical side surface which extends downward from the flat bottom, and
   a flare-shaped side surface which spreads downward from the vertical side surface.

16. The plasma processing apparatus of claim 12, wherein each of the at least three grooves of the annular member is defined by a curved bottom.

17. The plasma processing apparatus of claim 12, wherein each of the at least three grooves of the annular member is defined by:
   a flat bottom, and
   a flare-shaped side surface which spreads downward from the flat bottom.

18. The plasma processing apparatus of claim 12, wherein each of the at least three grooves of the annular conductive ring has a bottom having a shape to be fitted into a tip of a upper supporting portion of the cylindrical lift pin, and a flare-shaped side surface which spreads downward from the bottom.

19. A plasma processing apparatus, comprising:
   a plasma processing chamber;
   a substrate support disposed in the plasma processing chamber, the substrate support having a substrate supporting surface and a ring supporting surface;
   a first annular member disposed on the ring supporting surface, the first annular member having at least three through holes, each of the at least three through holes having an upper hole portion and a lower hole portion, the upper hole portion having a first width in a first direction and a second width in a second direction orthogonal to the first direction, the second width being smaller than the first width, the lower hole portion having a flaring shape spreading downward when viewed from a side;
   a second annular member supported by the first annular member, the second annular member having at least three grooves on a lower surface, the at least three grooves corresponding to the at least three through holes, respectively, each of the at least three grooves having a third width in a third direction and a fourth width in a fourth direction orthogonal to the third direction, the fourth width being smaller than the third width;
   at least three lift pins disposed below the ring supporting surface, the at least three lift pins corresponding to the at least three grooves, respectively, each of the at least three lift pins having an upper supporting portion and a lower supporting portion, the upper supporting portion being configured to support the second annular member from downward by contacting a bottom of the groove of the second annular member through the through hole of the first annular member, the lower supporting portion being configured to support the first annular member from downward by contacting an inclined surface of the first annular member, the inclined surface defining the lower hole portion; and
   at least one actuator configured to vertically move the at least three lift pins.

* * * * *